United States Patent
Folta et al.

(10) Patent No.: US 6,524,449 B1
(45) Date of Patent: Feb. 25, 2003

(54) METHOD AND SYSTEM FOR PRODUCING SPUTTERED THIN FILMS WITH SUB-ANGSTROM THICKNESS UNIFORMITY OR CUSTOM THICKNESS GRADIENTS

(76) Inventors: James A. Folta, 2262 Hampton Rd., Livermore, CA (US) 94550; Claude Montcalm, 14 Jami St., Livermore, CA (US) 94550; Christopher Walton, 2927 Lorina St., #2, Berkeley, CA (US) 94705-1852

(*) Notice: Subject to any disclaimer, the term of this patent is extended or adjusted under 35 U.S.C. 154(b) by 0 days.

(21) Appl. No.: 09/454,673

(22) Filed: Dec. 3, 1999

(51) Int. Cl.[7] .................. C23C 16/00; C23C 14/34; G06F 19/00
(52) U.S. Cl. ................ 204/192.13; 204/298.03; 118/663; 118/664; 118/665; 118/730; 427/8; 427/9; 700/116
(58) Field of Search ............ 204/192.13, 298.03; 118/663, 664, 665, 730; 427/8, 9; 700/116

(56) References Cited

U.S. PATENT DOCUMENTS

| | | | |
|---|---|---|---|
| 4,858,556 A | 8/1989 | Siebert | 118/664 |
| 5,234,561 A | 8/1993 | Randhawa et al. | 204/192.38 |
| 5,240,583 A | 8/1993 | Ahonen | 204/298.04 |

OTHER PUBLICATIONS

"The Interactive Data Language," by Reserach Systems, Inc., downloaded from Internet (http://www.rsinc.com/idl/index.cfm) on Aug. 2, 1999 (3 pages).

"Multilayer Coatings of 10X Projection Optics for Extreme–Ultraviolet Lithography," C. Montcalm, et al., Emerging Lithographic Technologies III, Mar. 15–17, 1999 SPIE Proceedings Series, vol. 3676, pp. 710–716.

"Multilayer Coating of 10X Projection Optics for Extreme–Ultraviolet Lithography," C. Montcalm, et al., presented at the SPIE Conference on Microlithography—Emerging Lithographic Technologies III, at Santa Clara, California, Mar. 14–19, 1999 (12 pages).

"Advances in Multilayer Reflective Coatings for Extreme–Ultraviolet Lithography," James A. Folta, et al., Emerging Lithographic Technologies III, Mar. 15–17, 1999 SPIE Proceedings Series, vol. 3676, pp. 702–709.

(List continued on next page.)

Primary Examiner—Rodney G. McDonald
(74) Attorney, Agent, or Firm—Sierra Patent Group, Ltd.; Andrew V. Smith

(57) ABSTRACT

A method and system for producing a thin film with highly uniform (or highly accurate custom graded) thickness on a flat or graded substrate (such as concave or convex optics), by sweeping the substrate across a vapor deposition source with controlled (and generally, time-varying) velocity. In preferred embodiments, the method includes the steps of measuring the source flux distribution (using a test piece that is held stationary while exposed to the source), calculating a set of predicted film thickness profiles, each film thickness profile assuming the measured flux distribution and a different one of a set of sweep velocity modulation recipes, and determining from the predicted film thickness profiles a sweep velocity modulation recipe which is adequate to achieve a predetermined thickness profile. Aspects of the invention include a practical method of accurately measuring source flux distribution, and a computer-implemented method employing a graphical user interface to facilitate convenient selection of an optimal or nearly optimal sweep velocity modulation recipe to achieve a desired thickness profile on a substrate. Preferably, the computer implements an algorithm in which many sweep velocity function parameters (for example, the speed at which each substrate spins about its center as it sweeps across the source) can be varied or set to zero.

47 Claims, 9 Drawing Sheets

OTHER PUBLICATIONS

"Advances in Multilayer Reflective Coatings for Extreme–Ultraviolet Lithography," James A. Folta, et al., presented at the SPIE Conference on Microlithography—Emerging Lithographic Technologies III, at Santa Clara, California, during Mar. 14–19, 1999 (12 pages).

"Multilayer Reflective Coatings for Extreme–Ultraviolet Lithography," C. Montcalm, et al., proceedings of the SPIE Conference on Microlithography—Emerging Lithographic Technologies II, at Santa Clara, California, Feb. 23–25, 1998 SPIE Proceedings Series, vol. 3331, pp. 42–51.

"Ni–$B_4C$ Graded Multilayers for X–Ray Applications," by Morawe, et al., (English language abstract distributed at Workshop on *Nanometer–scale Methods in X–Ray Technology* (*NSMXT*), Oct. 6–9, 1997, Costa da Caprica, Portugal.)

"Design and Performance of Graded Multilayers as Focusing Elements for X–Ray Optics," Morawe, et al., *Review of Scientific Instruments*, vol. 70, No. 8, Aug. 1999, pp. 3227–3232.

Sputter Source Distribution

Predicted Uniformity

Sample Calculations with Postulated Source Profile

ALS Measurements on Test Specimen

METHOD AND SYSTEM FOR PRODUCING SPUTTERED THIN FILMS WITH SUB-ANGSTROM THICKNESS UNIFORMITY OR CUSTOM THICKNESS GRADIENTS

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The invention relates to methods and apparatus for producing thin films on substrates by vapor deposition (e.g., sputtering). The invention pertains to improving the accuracy of the deposited film thickness across the substrate (e.g., by improving the uniformity of the film thickness across the substrate where it is desired to deposit a film having uniform thickness).

2. Discussion of the Related Art

Thin film coatings are typically produced by various vapor deposition methods (such as sputtering, CVD, and electron beam evaporation) in which the substrate to be coated is passed through a vapor of the coating material and accumulates a thin film through condensation of the vapor. For many applications, such as optical films for EUV (extreme ultra violet) lithography, it is desirable that the coating be very uniform in thickness (e.g., with no more than 0.1% variation in thickness across the coated substrate). Multilayer coatings for EUV optics are commonly applied using DC magnetron sputtering.

FIG. 1 is a side cross-sectional view of a DC magnetron sputtering system, and FIG. 2 is a cross-sectional view of the FIG. 1 system taken along line 2—2 of FIG. 1. The system of FIGS. 1 and 2, described in pending U.S. patent application Ser. No. 08/607,054, filed Feb. 22, 1996 by Vernon and Ceglio (assigned to the assignee of the present application), includes housing 10 (which has a cylindrical sidewall) and two rectangular sources (of sputtered atoms) located 180 degrees apart (relative to the system's vertical central axis through the center of shaft 6) at opposite sides of housing 10. One source is surrounded by chimney 2; the other is surrounded by chimney 2A. Chimneys 2 and 2A limit the deposition zone for each source (in which sputtered atoms can be deposited on substrate 11 or 12) to the area directly above the target (3 or 3A) of each source. The two substrates (11 and 12) are held face down on rotatable platter 5 above the sources, at locations 90 degrees apart with respect to the axis of shaft 6.

Multilayers (alternating layers of two different materials) can be deposited on each of substrates 11 and 12 by sweeping the substrates across the sources (by controlled rotation of shaft 6 and hence platter 5 relative to the stationary housing 10 and the stationary sources).

More specifically, the system of FIGS. 1 and 2 includes a first source comprising magnetron 1, chimney 2, and target 3 positioned within chimney 2 in the electric and magnetic fields produced by element 1 (such that ions present within chimney 2, e.g., ions created within chimney 2, will accelerate toward and be incident on target 3). In response to collisions of the ions (which can be argon ions) with target 3, a vapor of sputtered atoms 4 is produced in the volume surrounded by chimney 2. Some of atoms 4 will be deposited on the downward-facing surface of substrate 11 (or 12), when the substrate (11 or 12) is exposed to sputtered atoms 4 in chimney 2.

Similarly, the system also includes a second source comprising magnetron 1A, chimney 2A, and target 3A positioned within chimney 2A in the electric and magnetic fields produced by element 1A (such that ions created within chimney 2A will accelerate toward and be incident on target 3A). In response to collisions of the ions with target 3A, a vapor of sputtered atoms 4A is produced in the volume surrounded by chimney 2A. Some of atoms 4A will be deposited on the downward-facing surface of substrate 11 (or 12), when the substrate (11 or 12) is exposed to sputtered atoms 4A in chimney 2A.

Each of two substrate holders 9 (only one of which is visible in FIG. 1) is fixedly mounted to the lower end of one of shafts 8 (only one of which is visible in FIG. 1) so as to fit in an orifice extending through platter 5. Substrate 11 is mounted on substrate holder 9, with a downward facing surface to be coated. Shaft 8 is rotatably connected to spinner 7, so that spinner 7 can cause shaft 8, holder 9, and substrate 11 to rotate as a unit relative to platter 5, whether or not platter 5 is itself rotating relative to housing 10. Similarly, substrate 12 (shown in FIG. 2 only) is mounted on a substrate holder 9 (not visible in FIGS. 1 and 2) in turn fixedly mounted to a shaft 8, and the shaft is rotatably connected to a spinner (identical to spinner 7). During operation, elements 1, 2, 3, 1A, 2A, and 3A remain stationary within housing 10, while platter 5 rotates to sweep substrates 11 and 12 sequentially across chimneys 2 and 2A (typically while substrates 11 and 12 are rotated about their centers by the spinners relative to platter 5).

To deposit typical multilayer coatings on the substrates, atoms 4 (in chimney 2) are different (i.e., have a different atomic weight) than atoms 4A in chimney 2A. In some implementations, atoms 4 are Molybdenum atoms and atoms 4A are silicon (or beryllium) atoms (and magnetrons 1 and 1A produce a plasma of ultrapure Argon ions at a pressure of about 1.00 mTorr, with source powers of 360 W and 170 W, respectively, for magnetrons 1A and 1). Platter 5 is rotated within housing 10 (at a first rotational speed) while each substrate spins (at a speed much greater than the first rotational speed) relative to platter 5. During each revolution of platter 5 relative to housing 10, each of substrates 11 and 12 sweeps sequentially across chimney 2 and chimney 2A, so that one layer of atoms 4 and then one layer of atoms 4A condenses on each substrate. The thickness of each layer is determined by the time that the substrate is exposed to the vapor (4 or 4A), which is in turn determined by the substrate transit velocity. The arrangement of substrates 11 and 12 and chimneys 2 and 2A is such that no more than one substrate is over one source at any time. Therefore, the two substrates can be independently coated with identical or completely different multilayer structures.

By rapidly spinning substrate 11 (or 12) about its own axis of symmetry relative to platter 5, better azimuthal uniformity of the condensed coating can be achieved. However, radial non-uniformities in coating thickness typically result.

To compensate for radial non-uniformities in coating thickness, a carefully shaped mask can be inserted between each substrate and the sputtered atom vapor to which the substrate is exposed. However, such a masking operation requires tedious iteration to determine the optimal shape of each mask, and can be impractical for cases in which very high uniformity is required. Use of masks also prevents independent deposition of two different coating distributions on a masked substrate as the masked substrate sweeps sequentially across two sources during a single platter rotation. Also, a mask is not suitable for a substrate whose center must be coated, since the mask cannot be perfectly positioned at the center of rotation of a spinning substrate, and thus a small spot at the center of the masked substrate will be coated with the wrong thickness.

Another approach is to use a "baffle" which is a shaped piece of metal that is stationary with respect to the source (unlike a mask which moves together as a unit with the substrate, as the substrate moves relative to the source) and is present between the substrate and the sputtered atom vapor to which the substrate is exposed. Use of baffles allows independent deposition of two different coating distributions on a masked substrate as the masked substrate sweeps sequentially across two sources during a single platter rotation. However, use of baffles prevents independent deposition of different coating distributions on two substrates, each of which sweeps sequentially across a source during a single platter rotation. As will be apparent from the description below of the invention, the present invention avoids use of baffles or masks, allows independent deposition of two different coating distributions on a substrate as the substrate sweeps sequentially across two sources during a single platter rotation, and also allows independent deposition of different coating distributions on two substrates, each of which sweeps sequentially across a source during a single platter rotation.

An alternative technique for improving coating thickness uniformity is described in the above-cited U.S. Patent Application by Vernon and Ceglio. In accordance with this technique, the platter velocity is modulated (as a function of time) while the substrate sweeps across each source, in such a manner to produce a desired radial variation in coating thickness on the substrate (typically an acceptably small radial variation in coating thickness on the substrate). Vernon does not teach how to determine a non-constant platter velocity (platter velocity which varies as a function of time) so as to produce a desired radial variation in coating thickness on the substrate, and apparently contemplates that this would be determined in trial and error fashion or precalculated in some unspecified fashion. However, the trial and error empirical approach to optimizing the platter velocity function (platter velocity as a function of time) in an effort to achieve a desired radial variation in coating thickness (e.g., an acceptably uniform thickness) has proved to be incapable of achieving adequate uniformity on acceptably small substrates for some applications (e.g., the 0.1%, or better, uniformity needed for EUV lithography) without use of baffles or masks.

Until the present invention, it had not been known how to achieve deposited coating thickness uniformity of better than 0.44% across typical substrates, or how to achieve coating thickness having a precisely predetermined (nonuniform) profile across typical substrates (including curved substrates such as EUV optics as well as flat substrates).

SUMMARY OF THE INVENTION

In preferred embodiments, the invention is a method for depositing a thin film with highly uniform (or highly accurate custom graded) thickness over a substrate surface, by sweeping the substrate across a region containing a vapor of the coating substance (referred to as a vapor deposition "source" of coating material) with controlled velocity (where the controlled velocity is determined in accordance with the invention). The method includes the steps of:

measuring the source flux distribution (using a test piece that is held stationary in a position in which it is exposed to the source); calculating a set of predicted film thickness profiles, each film thickness profile assuming the measured source flux distribution and a different one of a set of sweep velocity modulation recipes (each "sweep velocity modulation recipe" indicating sweep velocity of a substrate relative to the source, as a function of time during a time interval in which the substrate sweeps across the source, the sweep velocity being either time-varying or constant); and then determining an optimal (or nearly optimal) sweep velocity modulation recipe to achieve a desired thickness profile (typically by selecting the velocity modulation recipe which corresponds to the predicted film thickness profile which best matches the desired thickness profile). Preferably also, a thin film having the desired thickness profile is deposited on a substrate surface by sweeping the substrate across the source with the optimal velocity modulation recipe.

An aspect of the invention is a practical method of measuring the flux distribution from the source with high accuracy. Another aspect of the invention is a method for calculating what velocity modulation recipe is needed to give the desired thickness profile on the substrate. Both aspects of the invention are applicable not only to flat substrates, but also to both concave and convex curved optics (i.e., optics having nonzero curvature).

Preferably, a computer is programmed to process measured flux distribution data (for a given source or set of sources) to generate a set of predicted coating thickness profiles, each corresponding to a different substrate sweep velocity function, and to allow the user to conveniently determine an optimal substrate sweep velocity function (for achieving a predetermined coating thickness profile on each substrate). In general, each sweep velocity function specifies how the sweep velocity varies over time. In a preferred implementation, the computer is programmed to implement an algorithm in which many sweep velocity function parameters (for example, the speed at which each substrate spins about its central axis as it is swept across the source by a rotating platter) are (or can be) varied or set to zero.

In preferred implementations, the computer is programmed to have a user interface which displays predicted peak-to-valley coating thickness error for each of a number of substrate sweep velocity functions (preferably in the form of a contour map), and a cursor. By manipulating an input device (e.g., a mouse) the user can select any of a number of points on the thickness error display, and in response to each selected point, the computer displays a graph of predicted coating thickness as a function of position on the substrate (for the corresponding sweep velocity function). By inspecting the displayed graph for each of several points on the thickness error display, the user can conveniently determine an optimal substrate sweep velocity function (for achieving a predetermined coating thickness profile on the substrate).

The inventors have recognized that slow spin speeds for the substrate (while the substrate is swept across the source) give rise to a ripple effect (rapid oscillation of coating thickness as a function of radius across the substrate), which may or may not be acceptable for specific applications.

BRIEF DESCRIPTION OF THE DRAWINGS

FIG. 4 shows that the peripheral point's path 31 is very different from the center point's path 30.

In FIG. 9, there is a variation of 0.11% (peak-to valley) in coating thickness across the flat substrate. This corresponds to a 0.3 nm variation, which represents the size of only 1.2 of the atoms comprising the coating.

DETAILED DESCRIPTION OF PREFERRED EMBODIMENT

The invention pertains to methods and systems for vapor deposition (such as sputtering, CVD, and electron beam evaporation methods and systems) in which a substrate to be coated is passed through a vapor of the coating material and accumulates a film (typically a very thin film) of the coating material through condensation of the vapor.

Figure 1:
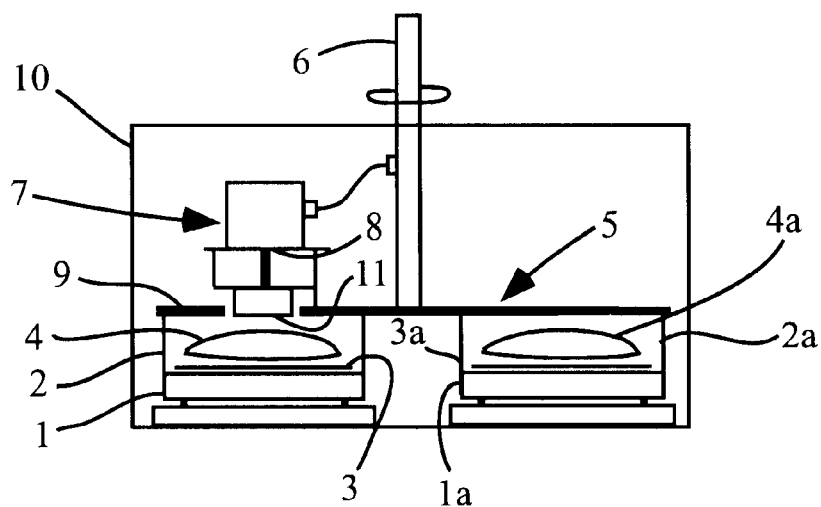
FIG. 1 is a side cross-sectional view of a conventional DC magnetron sputtering system.
Figure 2:
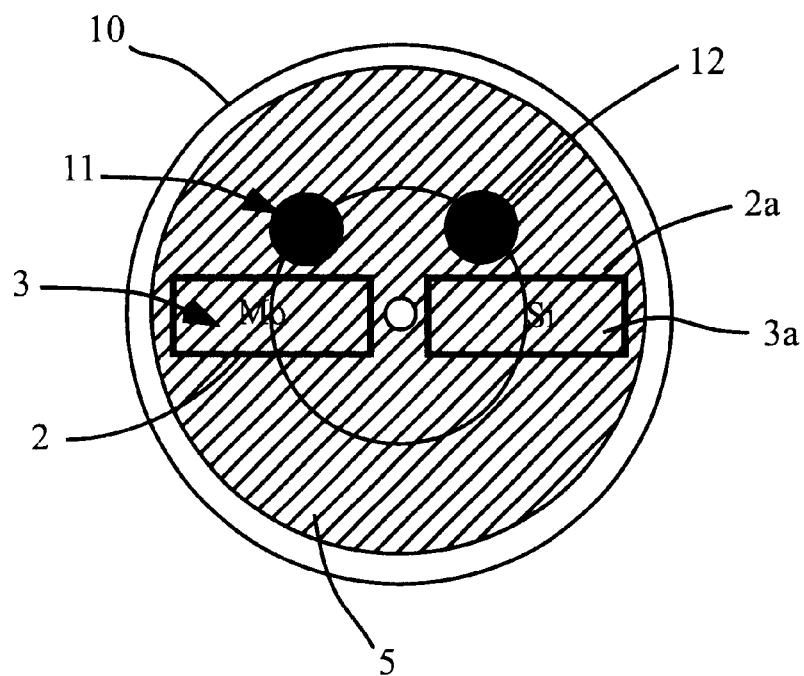
FIG. 2 is a cross-sectional view of the FIG. 1 system taken along line 2—2 of FIG. 1.
Figure 3:
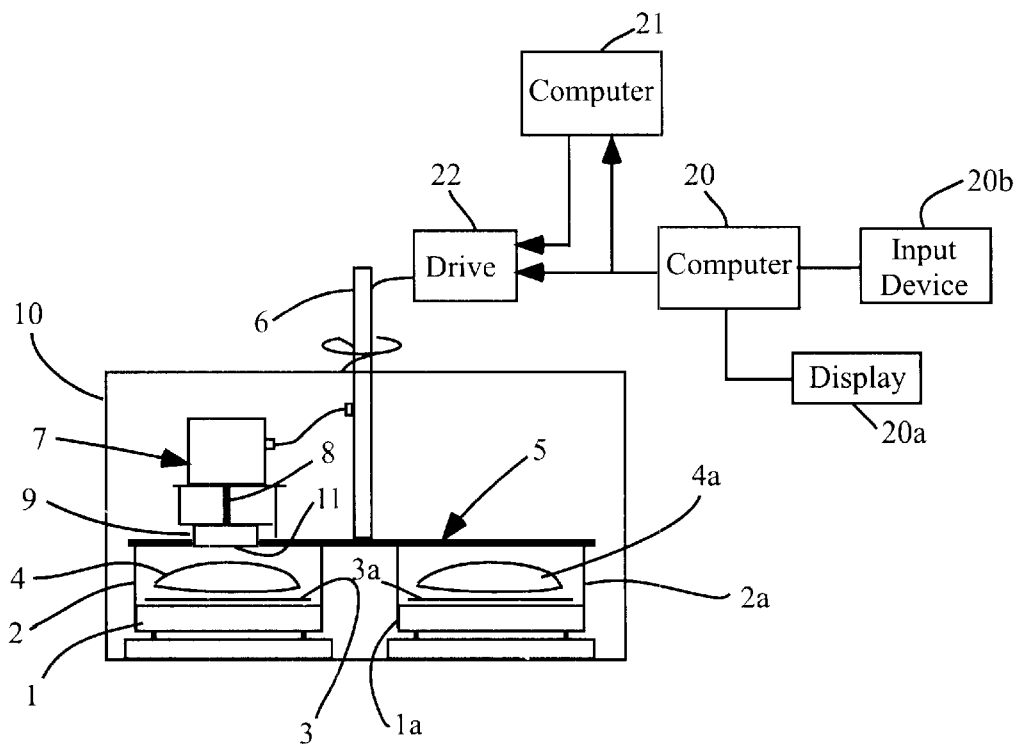
FIG. 3 is a side cross-sectional view of a DC magnetron sputtering system which embodies the invention.

A first preferred embodiment of the invention will be described with reference to FIGS. 3–12. FIG. 3 is a cross-sectional view of a DC magnetron sputtering system which embodies the invention. The FIG. 3 system differs from that of FIGS. 1 and 2 only in that it includes: computer 20, which includes a display device 20A and an input device 20B (e.g. a mouse), and which is programmed to process measured flux distribution data (to be described) to generate predicted coating thickness profiles (each corresponding to a different selected substrate sweep velocity function) and to determine an optimal substrate sweep velocity function (for achieving a predetermined coating thickness profile on each substrate); and shaft drive unit 22 which is coupled to shaft 6 and computer 20 and configured to rotate shaft 6 with a time-dependent rotational speed (determined by control signals from computer 20) to implement a predetermined substrate sweep velocity function.

Drive unit 22 can be coupled to computer 21 in addition to (or instead of) computer 20. Computer 21 is programmed to assert control signals for controlling rotation of shaft 6 in accordance with the optimal substrate sweep velocity function determined by computer 20. Computer 20 can be programmed to determine the optimal substrate sweep velocity function, data indicative of the optimal substrate sweep velocity function can then be loaded into computer 21, and computer 21 can then generate and assert to drive unit 22 the control signals for controlling rotation of shaft 6.

The FIG. 3 system can be used to perform the inventive method as follows: the flux distribution of the first source (comprising elements 1, 2, and 3) is measured using a test piece held stationary (by holder 9) at the first source, the flux distribution of the second source (comprising elements 1A, 2A, and 3A) is measured using another test piece held stationary (by holder 9) at the second source, and the measured data is processed by computer 20 to calculate the predicted thickness profile of a film layer deposited by either source (under any of a variety of sweep velocity modulation recipes), and computer 20 determines an optimal (or nearly optimal) sweep velocity modulation recipe for each source (for achieving a desired thickness profile on a substrate as the substrate is swept across the source with a time-dependent velocity determined by such profile). Preferably also, a coating having the desired thickness profile is then deposited on a substrate as the substrate is swept across one of the sources with a time-dependent velocity determined by the optimal (or nearly optimal) profile. In some embodiments, a multilayer coating (comprising pairs of sequentially deposited layers each having a desired thickness profile) is deposited on the substrate as the substrate is swept sequentially both sources with a time-dependent velocity (during each transit across a source) which is determined by the optimal (or nearly optimal) profile for such source.

The step of measuring the flux distribution of either source of the FIG. 3 system (which is the thickness per unit of time of a layer deposited on a substrate held fixed relative to the source, as a function of position on the substrate) is preferably performed as follows. A wafer is patterned (using photoresist/lithographic techniques) to have an array of features (preferably thin channels) in a layer of photoresist. The patterned wafer is mounted to platter 5 (i.e., substrate 11 of FIG. 3 is the patterned wafer in this embodiment), and a thick film is coated (by vapor deposition) on the patterned wafer as the wafer is held stationary over the source. When the patterned wafer has been coated by the source, the vapor deposited material (e.g., sputtered material) is deposited in the channels (or other features) and on the photoresist. Next the photoresist is removed (via the conventional technique known as "lift-off"), leaving the sputtered material in the channels as an array of elevated features (a pattern comprising elevated features). The features are preferably thin lines, but they can alternatively have other shapes such as dots, dashes, or curves. The height of these elevated features is measured with high accuracy (i.e., to within about 10 Angstroms) with a profilometer (preferably a conventional mechanical profilometer).

Multiple measurements of the elevated feature heights over each large wafer gives a sampling of the deposition rate over the entire source. In the case of systems which include multiple sources (e.g., the system of FIG. 3 for producing multilayer films) the distribution of each sputter source is measured.

The advantage of using the above-described preferred method for measuring source flux distribution is that it measures flux distribution with excellent accuracy and with a large dynamic range (a commercially available profilometer can measure film thicknesses in a range from a few nm to 1000 nm, accurate to a few tenths of 1%). Other experimental methods for measuring flux distribution, such as by measuring optical transmission or conductivity of the deposited film could be used for some applications, but they are not sufficiently accurate over the range of vapor deposited layer thicknesses required for optical elements for use in EUV lithography, and typically do not allow measurement with a sufficient dynamic range. If the measured flux distribution is measured with insufficient accuracy, theoretical models for predicting vapor deposited film thickness profiles (assuming the measured flux distribution and assuming various modulated sweep velocity recipes for sweeping the substrate across the source) will also lack the required accuracy.

Another aspect of the invention is a computer implemented method (performed in some embodiments by computer 20, or computers 20 and 21, of FIG. 3) which implements a computational model using measured source flux distribution data as an input to predict the film thickness profile on a substrate that will result by using one vapor deposition source with the substrate being swept across the source according to any of a variety of sweep velocity modulation recipes (e.g., recipes for modulating the rotational velocity of platter 5 of FIG. 3 as a function of time). Typically, the model assumes that the substrate spins (relative to the platter) about its center at a constant speed (much faster than the substrate sweep speed) while the platter sweeps it across the source with time varying velocity. However, we also contemplate performing the thickness profile calculation with a less stringent assumption, such as the assumption that the substrate spins with a selected time-varying speed while it is swept across the source or the assumption that the substrate does not spin (relative to the platter) during at least part of the time that it is swept across the source. The model (used by programmed computer 20 to perform the thickness profile calculation) should take into account the measured source flux distribution (which must be input to the computer), the sweep velocity (typically assumed to be time-varying) of the substrate's center across the source, and the angular velocity at which the substrate spins relative to the platter. By processing the inputs, the programmed computer calculates the trajectory of any point on the substrate over the source, and integrates the flux received at that point to obtain the final thickness. The calculation is repeated for different points on the substrate surface as needed, giving the final thickness profile.

Figure 4:
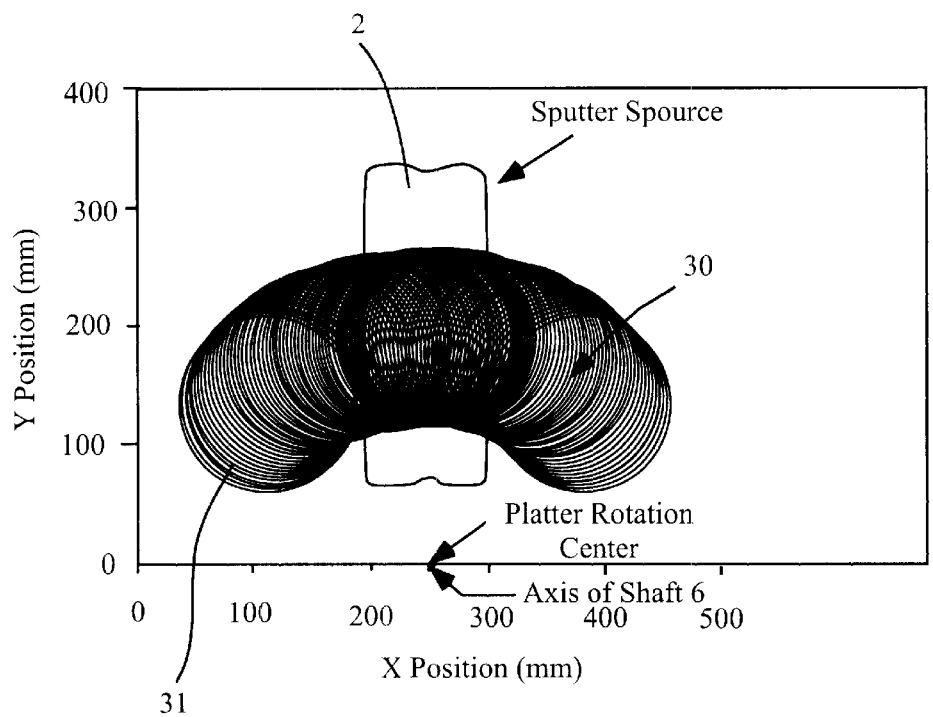
FIG. 4 is a diagram of the path (31) of a point on the periphery of disk-shaped substrate 11 of FIG. 3, and the path (30) of substrate 11's center, as the substrate translates across one of the sources of the FIG. 3 system (while the substrate spins about its center).

More specifically, in preferred embodiments, the computer is programmed in accordance with the invention to calculate a predicted thickness profile (a profile of predicted thickness of a film coating on the spinning substrate to be coated):

$$T(r,\phi) = \int_s \Phi(x,y) dS$$

where $T(r,\phi)$ is the film thickness at a point P (specified as $(r,\phi)$) on the spinning substrate; S is the path of the point P relative to the source; and $\phi(x,y)$ is sputtering rate of the source (referred to more generally herein as the flux distribution of the source) as a function of position over the source. $\phi$ has units of Å/second, depends on the position over the source, is preferably measured in the manner described above, and is input to the computer prior to execution of a coating thickness profile calculation. With reference to FIG. 4, the flux distribution of source 2 is a magnitude (a coating thickness deposition rate) for each position (x, y) of the source (viewed as in FIG. 4), and spiral path 31 represents the path S of a point P on the substrate (in FIG. 4, the point happens to be on the substrate's periphery).

For any point P on the substrate, the path S gives the position of the point P at any moment, and the above-noted integral for $T(r,\phi)$ simply multiplies the time that point P spends at each point over the source by the rate of film deposition there, and adds together all the resulting products to obtain the total thickness deposited at point P during the deposition run. The expression for path S contains the spin rate of the substrate, and the sweep velocity recipe which determines at what rate the spinning substrate is moved across the source. S is calculated as:

$$S(t) = \vec{r}_P(t) + \vec{r}_S(t).$$

The two r vectors ($r_s$ and $r_p$) are calculated as follows (resolving them into the (x,y) coordinates of the platter at the same time):

$$\vec{r}_S = r_S \cos(\omega t + \phi_0)\hat{x} + r_S \sin(\omega t + \phi_0)\hat{y}$$

is the radius vector from the center of the substrate to the point P, where point P spins at $\omega$ rev/sec about the substrate's center beginning at angular position $\phi_0$, and $$\vec{r}_P(t) = r_P \cos\theta(t)\hat{x} + r_P \sin\theta(t)\hat{y}$$

is the radius vector from the center of the platter to the center of the substrate. $\theta(t)$ is the angular position of the platter over time (which has instantaneous rotational velocity $\omega_{platter}$) ie., during the velocity modulation recipe.

The remaining problem for the code is to determine $\theta(t)$. The sweep velocity recipe is preferably programmed into the control system as angular velocity (of the platter) vs. angle (with respect to the platter's initial angle of orientation at the start of a deposition run), or $$\frac{d\theta}{dt}(\theta) = f(\theta)$$

$\theta(t)$ is determined from this by $$\frac{d\theta}{dt} = f(\theta) \rightarrow \frac{d\theta}{f(\theta)} = dt \rightarrow t = \int \frac{d\theta}{f(\theta)}$$

Defining $$F(\theta) \equiv \int \frac{1}{f(\theta)} d\theta$$

then $t=F(\theta)$ or $\theta(t)=F^{-1}(t)$ which is the function desired.

Given a velocity recipe $(d\theta/dt)(\theta)$, the code uses the described method to trace the path of the point at the center of the substrate ($r_s=0$) through one pass of the substrate over both sources (assuming two deposition sources 3 and 3A for multilayer coatings as in FIG. 3: one for depositing Mo; the other for depositing Si). The programmed computer adds the thickness accumulated at each instant (over each source) to get the total thickness at $r_s=0$. The calculation is then repeated at $r_s=5$ mm, $r_s=10$ mm, or whatever interval is desired, and the result is the final thickness profile over the entire range of radial positions within the substrate. The starting angular position of the substrate, $\phi_0$, is usually held at zero, because the substrate spin $\omega$ is very rapid, and hence there is little dependence of the coating thickness on $\phi_0$.

Figure 16:
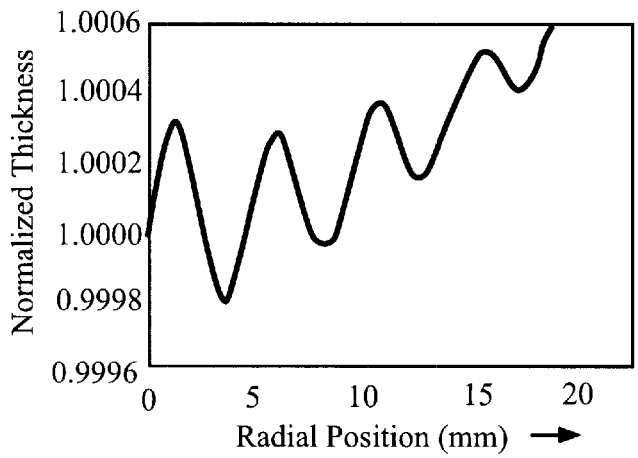
FIG. 16 is a graph of film thickness as a function of radial position, as predicted in accordance with the invention (for a disk-shaped sample having a multilayer coating, with the coating having been produced with the substrate spinning at low speed with respect to a platter while the platter sweeps the substrate across a vapor deposition source).

However, the model can just as easily be applied for a slow spin rate $\omega$, and in fact such calculations were done to verify that the spin rate $\omega$ being used was sufficiently high (the latter calculations resulted in generation of FIG. 16 which is discussed elsewhere herein).

Solving for the coating thickness one point at a time by tracing that point's path over each substrate has a number of important advantages. Previous work on predicting thickness profiles (as explained, for example, in U.S. patent application Ser. No. 08/607,054, filed Feb. 22, 1996 by Vernon and Ceglio) had treated the coating of a whole substrate as a single analytical integral. In contrast, the inventive approach allows consideration of finite substrate spin speeds (relative to the platter), it revealed the ripple effect (described with reference to FIGS. 16 and 17), and it can also be more easily and efficiently implemented in software.

In preferred embodiments, another module of the computer code then uses the described method to calculate the resulting thickness profile for each of a set of available two-velocity sweep recipes. The resulting thickness profiles are then searched, preferably using the animated graphical user interface described herein with reference to FIGS. 14 and 15, for a sweep recipe (an optimal or nearly optimal sweep recipe) which is predicted to give the desired coating thickness profile. In this way the inversion problem of how to calculate what $\theta(t)$ is needed to get the desired $T(r)$ is solved by the user searching visually, considering only a subset of the possible $\theta(t)$ (i.e., two-velocity sweep recipes only).

In other implementations, the computer code is generalized to calculate $T(r)$ for an arbitrary $\theta(t)$, represented by a stepped velocity modulation recipe (a recipe in which the substrate has three or more sweep velocities relative to each source during each deposition run. In such case, the thickness calculation is the same as that described above but the results cannot be searched with animated displays of the type shown in FIGS. 14 and 15 because with more than two sweep velocities in the recipe there are too many free parameters to represent all the possibilities on a flat display.

An alternative use of the same modules of computer code can solve the inversion problem more generally. Leaving $\theta(t)$ fixed ($\theta_i \in \{\theta_1, \theta_2, \theta_3, \ldots\}$) the inventive computer code calculates what $T(r)$ would result from keeping the platter fixed at each $\theta_i$ (i.e., $\theta_1 \rightarrow T_1(r)$, $\theta_2 \rightarrow T_2(r)$, ..., and $\theta_n \rightarrow T_n(r)$). Then the desired thickness profile $T(r)$ is written as a linear combination of the $T_i(r)$ $$T(r) = \sum_{i=1}^{n} a_i T_i(r)$$

and the velocity recipe needed to achieve this is then given by inverting the discrete function $t(\theta)$:

$$\theta(t) \rightarrow t^{-1}(\theta),$$

where $t(\theta)$ is given by the ordered pairs $(\theta_1, a_1)$ $(\theta_2, a_2)$ ... $(\theta_n, a_n)$. The $a_i$ represent the lengths of time that should be spent at the $\theta_i$ in order to give the desired thickness profile. The $a_i$ are thus points defining a discrete function $\theta(t)$ which is a stepwise velocity modulation recipe to give the desired film thickness profile. A continuous function approximating $\theta(t)$ would be written in practice to control the platter motion.

In this way the code can be used to solve the general inversion problem and write a recipe to achieve any thickness profile accessible with finite velocity recipes. It is contemplated that such embodiments of the inventive method can be performed iteratively (with any number of iterations), for example, as follows. From a desired film thickness profile (and data indicative of the measured flux distribution of a vapor deposition source), an inversion calculation is performed to determine a first sweep velocity modulation recipe that is predicted to achieve (at least approximately) the desired film thickness profile. Then, a vapor deposition operation is performed in which the source deposits a film on a test substrate while the test substrate is swept across the source in accordance with the first sweep velocity modulation recipe, and measured thickness data is generated by measuring the thickness as a function of position on the test substrate of the film so deposited. Then, from the measured thickness data, a "corrected" desired film thickness profile (i.e., one expected to compensate for thickness profile errors identified from the measured thickness data, without introducing significant additional error) is determined. Then, from the corrected desired film thickness profile (and the data indicative of measured flux distribution of the source), another inversion calculation is performed to determine a second sweep velocity modulation recipe that is predicted to achieve (at least approximately) the desired film thickness profile. Of course, additional iterations can be performed if necessary. Each such iteration would include a step of depositing a film is deposited on a test substrate, a step of determining a "corrected" desired film thickness profile, and a step of performing an inversion calculation to determine a sweep velocity modulation recipe.

In typical implementations of the invention (in which the source is sufficiently large relative to the spinning substrate so that there is a substrate position relative to the source in which the entire spinning substrate is exposed to and can be coated by the source), the programmed computer predicts the result of implementing each of many sweep velocity modulation recipes, wherein (in each recipe) the platter moves the substrate across the source according to a two-velocity cycle (while the substrate spins about its center relative to the platter at a specified spin speed, which can be zero): a first stage in which the platter moves the substrate at a first speed relative to the source while only a leading portion of the substrate (including the leading edge but not the substrate's center) is exposed to the source; a second stage in which platter moves the substrate at a second speed (typically faster than the first speed) relative to the source while at least a central portion of the substrate including the substrate's center is exposed to the source (e.g., the entire substrate including leading edge, trailing edge, and center, in implementations in which the substrate spin speed is sufficiently large relative to the platter speed); and a third stage in which the platter moves the substrate at the first speed relative to the source while only trailing portion of the substrate (including the trailing edge but not the substrate's center) is exposed to the source. In a final stage, in which the platter moves the substrate while no portion of the substrate is exposed to the source (e.g., after the trailing edge of substrate 11 has passed over the source and before substrate 11's leading edge again reaches of the source), the speed of the substrate relative to the source is irrelevant and can have any value (except to the extent that such speed is determined by speed requirements of a second substrate, where both the substrate and second substrate are moved by the same platter).

As noted, FIG. 4 is a diagram of the path (31) of a point on the periphery of disk-shaped substrate 11 of FIG. 3, and the path (30) of substrate 11's center, as the substrate translates across one of the sources of the FIG. 3 system (while the substrate spins about its center). FIG. 4 shows that the peripheral point's path 31 is very different from the center point's path 30.

Figure 5:
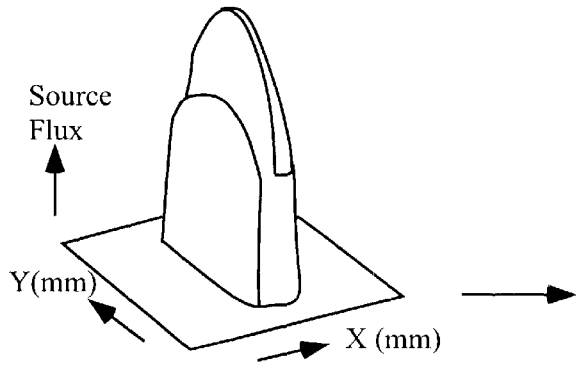
FIG. 5 is a graph of the source flux distribution for one of the sources of the FIG. 3 system.

FIG. 5 is a graph of the source flux distribution for one of the sources of the FIG. 3 system.

Figure 6:
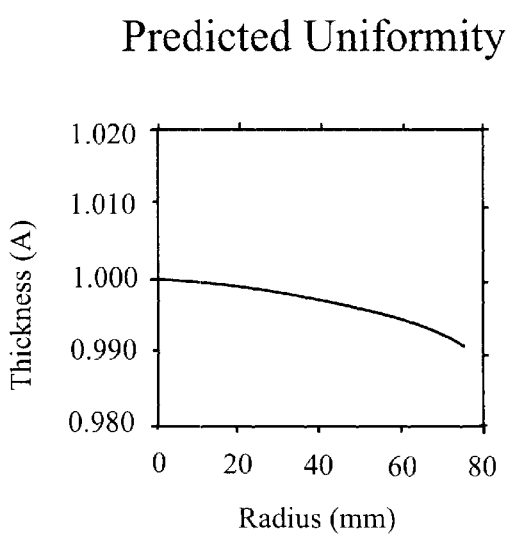
FIG. 6 is a graph of a predicted uniformity of film thickness deposited on substrate 11 by the system of FIG. 3 (using only one of the two sources) assuming constant (relatively low) rotational speed of platter 5 about shaft 6 and constant (relatively high) rotational speed of the substrate about shaft 8 during the vapor deposition, and assuming the nonuniform source flux distribution shown in FIG. 5 for the source employed to deposit the film.

FIG. 6 is a graph of a predicted uniformity of film thickness deposited on substrate 11 by the system of FIG. 3 (using only one of the two sources) assuming constant (relatively low) rotational speed of platter 5 and constant (relatively high) rotational speed of the substrate about shaft 8 during the vapor deposition, and assuming the nonuniform source flux distribution shown in FIG. 5 for the source employed to deposit the film.

In preferred implementations of the inventive method, the thickness profile is calculated for a large number of different two-velocity platter recipes (or all of such recipes) in advance. "Two-velocity platter recipe" is used herein to denote a sequence of platter velocities (in which the substrate spins about its center while it is moved by the platter relative to the source) which satisfy the following criteria: platter 5 is rotated at a first speed while a leading portion of a substrate passes over one of the sources (but before the substrate's center reaches the source); then, while at least a central portion of the spinning substrate is exposed to the source (typically the entire spinning substrate, for example when the substrate spin speed is sufficiently large relative to the platter speed and/or where the source is sufficiently large relative to the substrate), platter 5 is rotated at a second speed (typically faster than the first speed) until the substrate's central portion has passed beyond the source; and then platter 5 is again rotated at the first speed (at least until the substrate's trailing edge, and thus the entire substrate, has passed beyond the source). In a final stage, in which the platter continues to move the substrate while no portion of the substrate is exposed to the source (e.g., after the trailing edge of the substrate has passed over the source and before the substrate's leading edge again reaches the source), the speed of the substrate relative to the source is irrelevant and can have any value (except to the extent that such speed is determined by a speed requirement of a second substrate, where both the substrate and second substrate are moved by the same platter).

Also in preferred implementations, a user-interface is provided to allow the user to explore (i.e., "surf" through) an array of possible velocity recipes (sweep velocity modulation recipes): by selecting different ones of the velocity modulation recipes using a computer mouse, in order to view nearly instantly a display of the previously calculated predicted film thickness profile (resulting from and corresponding to each selected velocity modulation recipe); or by selecting different ones of the predicted film thickness profiles using a computer mouse, in order to view nearly instantly a display identifying the sweep velocity modulation recipe corresponding to each selected predicted film thickness profile). In this way, a computer programmed in accordance with the invention (to generate the predicted thickness profiles) can be used to select easily a sweep velocity recipe which is adequate to achieve the desired thickness profile (i.e., to select an optimal velocity recipe).

An important aspect of preferred implementations of the invention is that it characterizes each sweep velocity modulation recipe with only two parameters (e.g., each sweep velocity modulation recipe is a two-velocity recipe characterized by the ratio of velocities (V1/V2) and an offset angle which determines the transition points between the two velocities). This simple profile characterization allows use of the preferred graphical user interface (described with reference to FIGS. 14–15). Use of the preferred user interface in turn provides the user with insight into what could be done with two-velocity recipes that is invaluable in making good decisions on the use of limited coating time. For example, it will be apparent to the user from the user interface which recipe can achieve a desired combination of coating characteristics (e.g., uniformity across the sample) and efficient coating (e.g., coating with sufficiently fast substrate sweep velocity to avoid excessive time for coating, and coating with sufficient substrate spin speed to achieve desired coating ripple characteristics).

Figure 7:
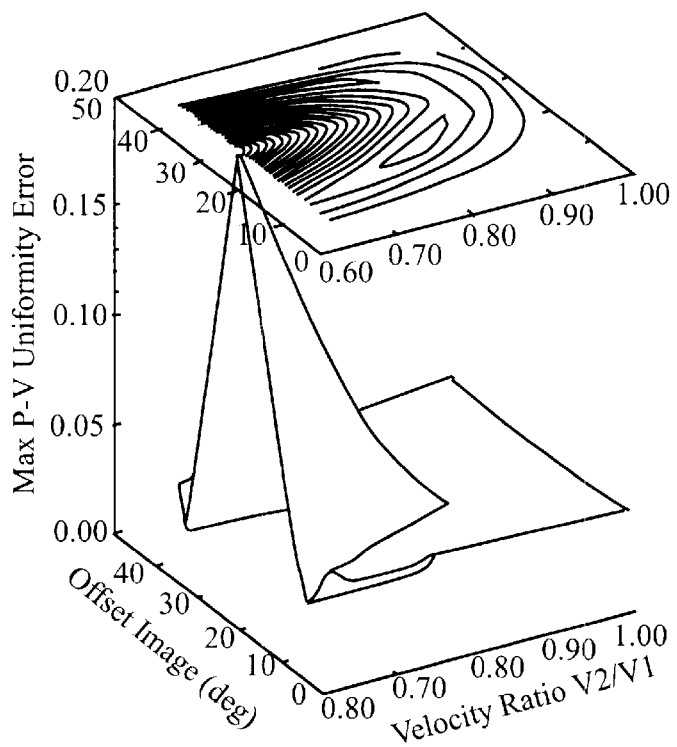
FIG. 7 is a three-dimensional graph of the predicted deposited film thickness uniformity (ratio of "peak" (maximum) thickness to "valley" (minimum) thickness for a film deposited on a flat substrate during one sweep of the substrate across a source) which is predicted to result from one sweep of a substrate across one source of the FIG. 3 system, for each of a set of two-velocity platter recipes (sweep velocity modulation recipes), wherein V2 is the speed at which the platter moves the substrate relative to the source while only the leading or trailing portion (not the center) of the substrate is exposed to the source, V1 is the speed at which the platter moves the substrate while the central portion of the substrate (the entire substrate including its center, if the substrate is spinning) is exposed to the source, and the "offset angle" is the angle traversed by the substrate (as it is swept by the platter around the platter's axis and across the source) from the start of the recipe (typically the time at which the platter is at −45 degrees, for most optics) until the time that the platter's speed undergoes the transition from V2 to V1.
Figure 8:
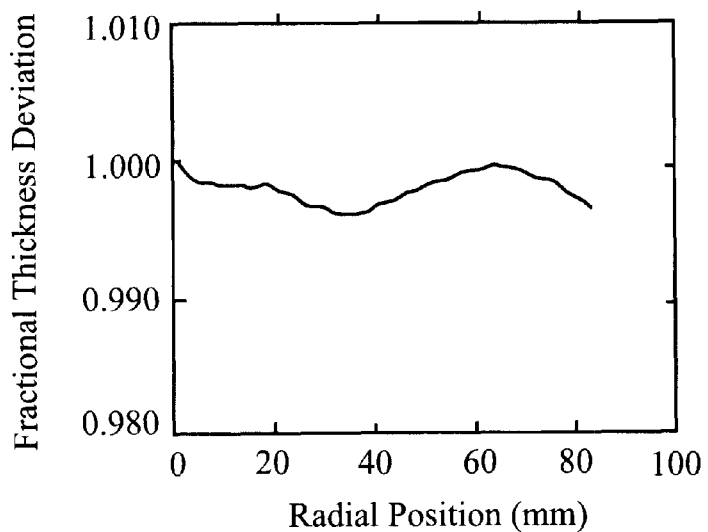
FIG. 8 is a graph of the radial film thickness profile for a nearly optimal recipe (selected from the set of two-velocity platter recipes employed to generate FIG. 7).

FIG. 7 is a three-dimensional graph of the predicted deposited film thickness uniformity (ratio of peak thickness to valley thickness) generated using the system of FIG. 3 to coat a flat substrate with each of a set of two-velocity platter recipes, wherein V2 is the speed at which the platter moves the flat substrate relative to the source while only the leading or trailing portion (not the center) of the substrate is exposed to the source, V1 is the speed at which the platter moves the substrate while the central portion of the substrate (the entire substrate including its center, if the substrate is spinning) is exposed to the source, and the "offset angle" is the angle traversed by the substrate (as it is swept by the platter around the platter's axis and across the source) from the start of the recipe (typically the time at which the platter is at −45 degrees, for most optics) until the time that the platter's speed undergoes the transition from V2 to V1. FIG. 7 assumes that the substrate is a flat disk having 6 inch diameter, the source has rectangular shape and size 4.3 inch ×10.7 inch (so that the relative size of the source and substrate are approximately as shown in FIG. 4), the center of the substrate is 8.75 inches from the center of the platter, and the substrate spins about its center (relative to the platter) at about 320 rpm (revolutions per minute). FIG. 8 is the radial film thickness profile for the nearly optimal platter recipe (selected from the set of two-velocity platter recipes employed to generate FIG. 7 with the criterion that it is a recipe predicted to cause an acceptably low difference of peak thickness and valley thickness during a sweep of the spinning substrate across the source) in which V1=0.809 rpm (revolutions per minute of the platter), V2=0.684 rpm (so that V2/V1=0.846), and the offset angle is 20.4 degrees. With this value of the offset angle, the offset angle is the angle traversed by the substrate, as it is swept across the source, from the start of the recipe until the time that the center of the substrate is still approximately 1.5 inches away from the source). The substrate sweep speed undergoes a transition from V2 to V1 when the center of the substrate is about 1.5 inches away from the source, and continues at V1 until the center of the substrate has reached a position about 1.5 inches beyond the source (at which time the substrate sweep speed undergoes another transition from V1 to V2).

The computational approach of the invention (for radial film thickness profile prediction) allows simulation of a finite spin velocity of the substrate, predicting a "ripple effect" which has been confirmed experimentally. It also provides a way to predict the sensitivity of the coating process to inaccuracies in substrate position, velocity, etc., which would be tedious to find experimentally and so provides critical guidance on how to improve the deposition system as well as achieve optimized operation.

Figure 9:
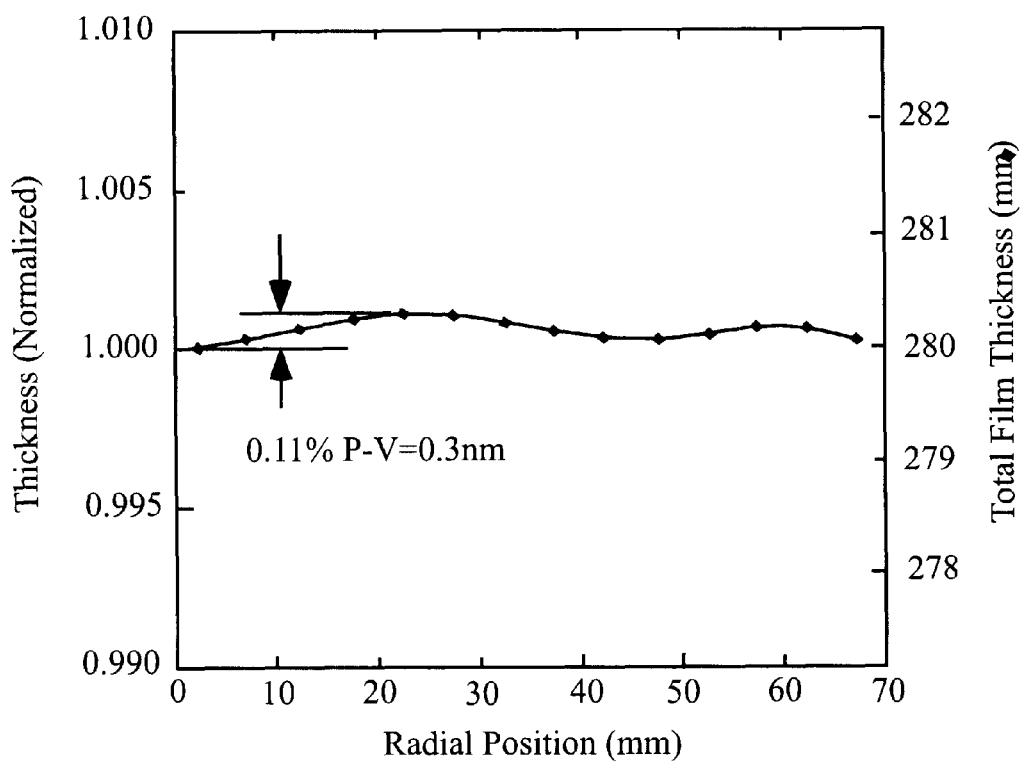
FIG. 9 is a graph of coating thickness as a function of radial position on a flat substrate (having six inch diameter), which has been achieved by performing the invention with the two-velocity platter recipe "R2" shown in FIG. 13.

The technique has been shown to work well on flat substrates. The inventors have been able to improve coating thickness uniformity (on wafers having 150 mm diameter) to 0.11%, with only a few deposition runs, as shown in FIG. 9. FIG. 9 assumes that the FIG. 3 system is used (with only one source; not two sources as shown in FIG. 3), and that the platter rotates the spinning substrate with a two-velocity substrate sweep velocity function (function R2 of FIG. 13) in which V1=0.809, V2=0.684 (so that V2/V1=0.846), and the offset angle is 17.6 degrees. In comparison, an empirical approach, in which intuition was used to set the platter velocity recipe, provided only 0.45% uniformity after 8 deposition runs. The inventive method also has the advantage of guiding the decision when more complex substrate sweep velocity modulation recipes (e.g., recipes with more than two sweep velocities) are needed.

It is straightforward to implement the invention with software that assumes sweep velocity modulation recipes with more than two sweep velocities (or two sweep velocities).

Figure 10:
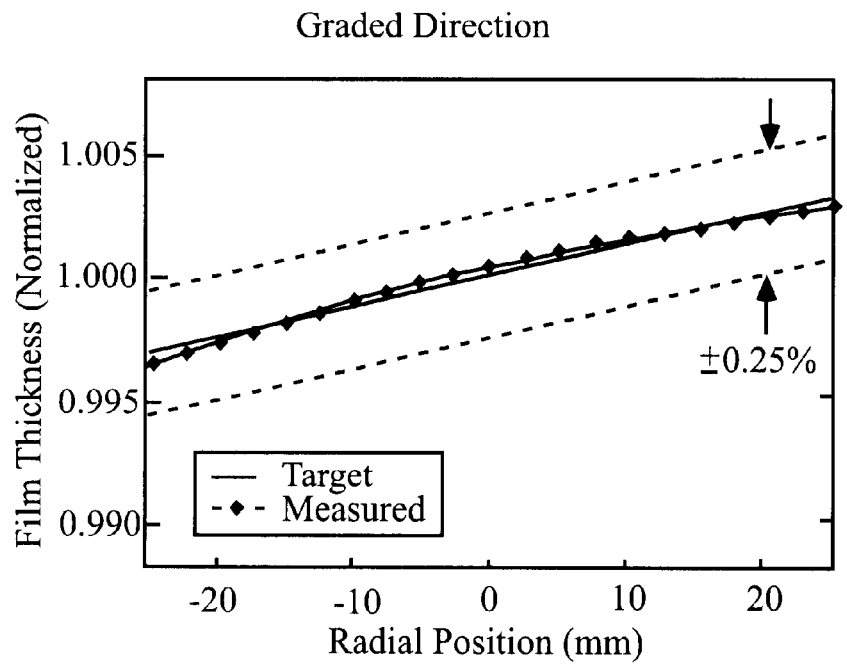
FIG. 10 is a graph of measured film thickness as a function of radial position along a first axis of a convex reflective optic (where the thickness of the optic, which is a mirror for use in a projection camera of an EUVL engineering test stand system, varies along the first axis), showing an extremely uniform coating achieved by depositing the coating using the two-velocity platter recipe "R1" shown in FIG. 13 (where this recipe had been determined in accordance with the invention to be optimal for this purpose).
Figure 11:
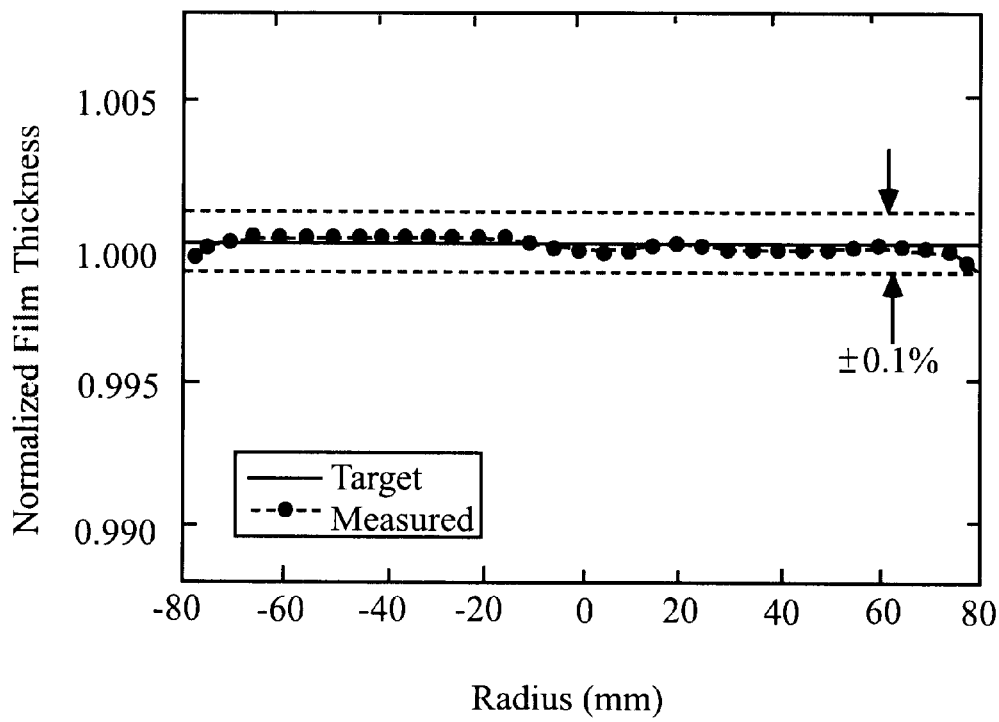
FIG. 11 is a graph of measured film thickness as a function of radial position along a second axis of the convex reflective optic of FIG. 10 (where the second axis is perpendicular to the first axis mentioned with reference to FIG. 10, and the thickness of the optic does not vary along the second axis), where the film has been deposited using the two-velocity platter recipe "R1" shown in FIG. 13.

The inventive technique has also been used to develop uniform coatings on curved substrates, such as convex or concave optics. In such cases, the effect of substrate height (and surface tilt) on deposition rate is measured experimentally. The height and tilt effects owing to substrate curvature can then be taken into account when selecting the best platter velocity recipe to achieve the desired film thickness profile. FIGS. 10 and 11 show the extremely uniform coating achieved on a convex optic (a convex mirror for use in the projection camera of an EUVL engineering test stand system), by determining the optimal two-velocity platter recipe which would achieve the uniform coating on the optic. FIG. 10 is a graph of film thickness measured as a function of radial position along a first axis of the convex reflective optic (where the thickness of the optic varies along the first axis), where the film had been deposited on the optic using the FIG. 3 system with the two-velocity platter recipe "R1" shown in FIG. 13 (where the inventive computer program had predicted that recipe "R1" would be optimal). FIG. 10 shows that an extremely uniform coating (with coating thickness that varies linearly with radial position along an appropriate axis of the optic) can be achieved on a convex optic by predicting (in accordance with the invention) an optimal platter velocity recipe for depositing the coating.

In FIG. 10 (and FIGS. 11 and 13 discussed below), the solid line is the desired profile, the plotted points are measured values, and the upper and lower dashed bands indicate the acceptable tolerance range.

Figure 18:
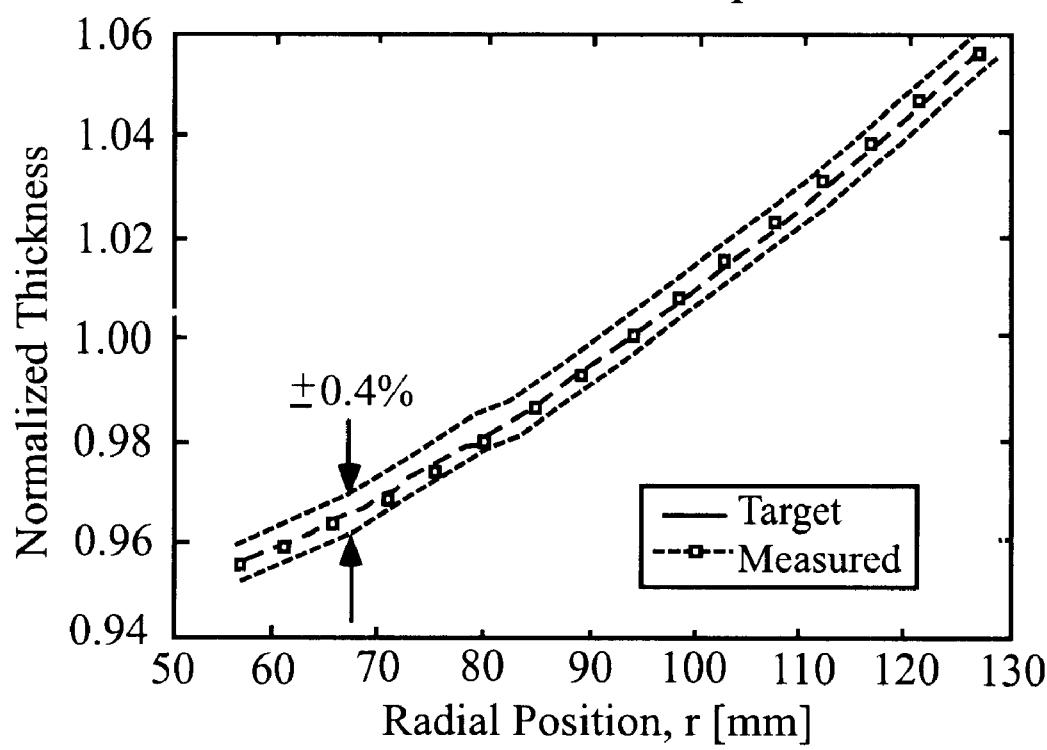
FIG. 18 is a graph of measured film thickness as a function of radial position along a first axis of a deeply convex optic (where the thickness of the optic varies along the first axis), showing an extremely uniform coating achieved by depositing the coating using a four-velocity platter recipe (where this recipe had been determined in accordance with the invention to be optimal for this purpose).

FIG. 18 is a graph of measured film thickness as a function of radial position along a first axis of another optic (a deeply convex EUVL condenser optic whose thickness varies along the first axis), showing an extremely uniform coating achieved by depositing the coating using a four-velocity platter recipe (where this recipe had been determined in accordance with the invention to be optimal for this purpose).

Figure 13:
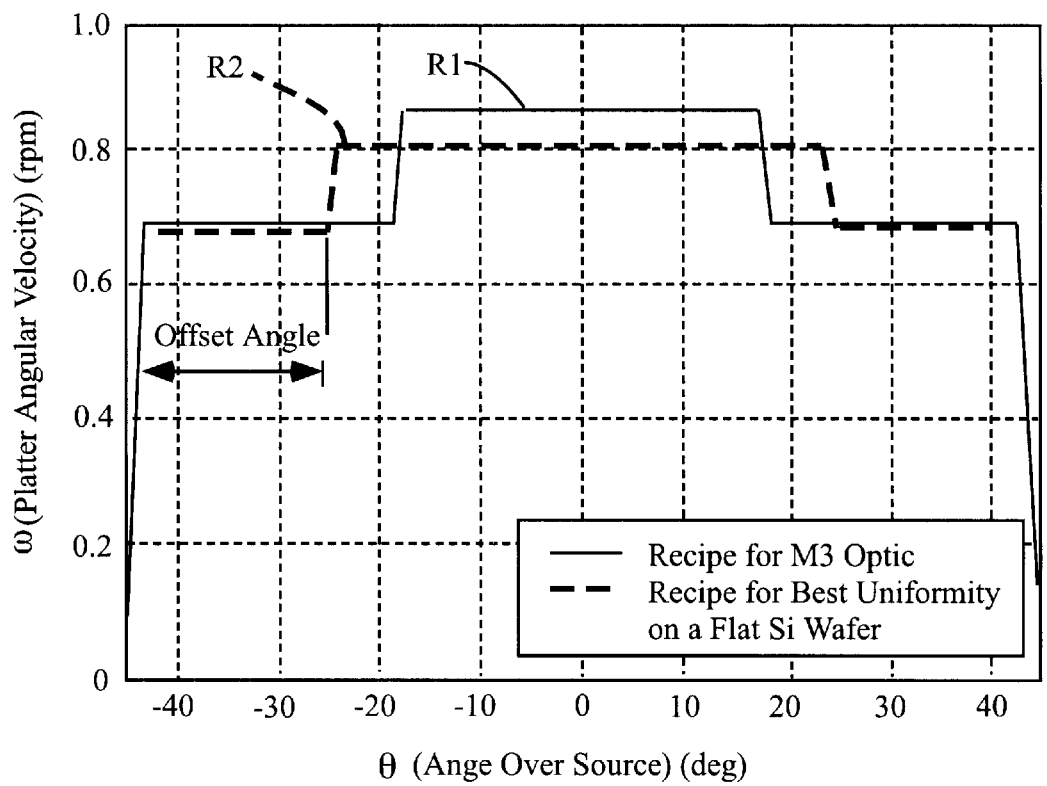
FIG. 13 is a graph representing two-velocity platter recipes "R1" and "R2" used to produce the coatings mentioned with reference to FIGS. 9–11.

FIG. 11 is a graph of measured film thickness as a function of radial position along a second axis of the convex reflective optic of FIG. 10 (where the second axis is perpendicular to the first axis mentioned with reference to FIG. 10, and the thickness of the optic does not vary along the second axis), where the film has been deposited using the two-velocity platter recipe "R1" shown in FIG. 13.

Figure 12:
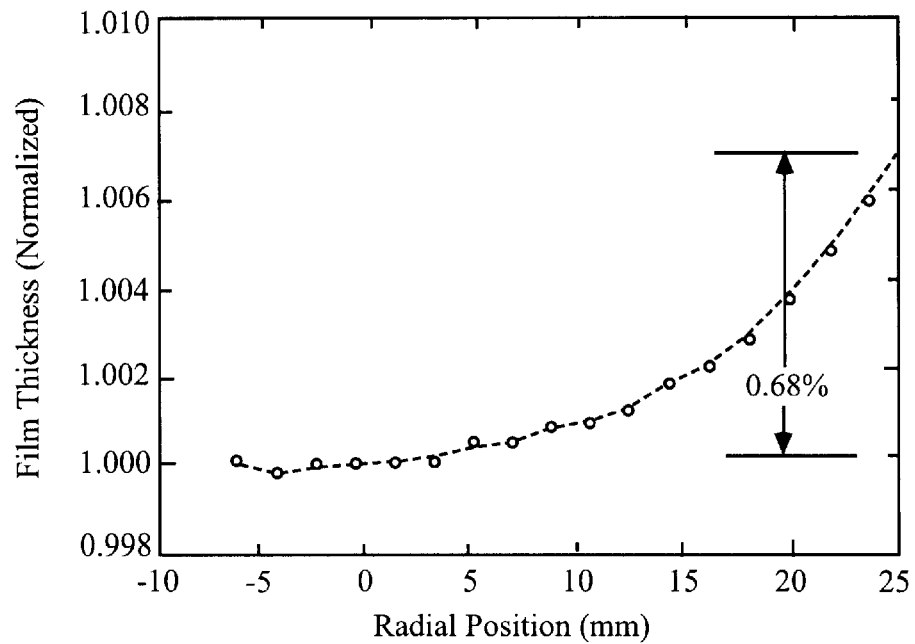
FIG. 12 is a graph of film thickness as a function of radial position on a flat substrate, showing the non-uniform coating distribution on the flat substrate which would result if the two-velocity platter recipe "R1" shown in FIG. 13 were used to coat the flat substrate rather than the convex mirror assumed in FIGS. 10 and 11.

While the height and tilt effects can be readily integrated into the inventive computer program, in order to generate FIGS. 10 and 11, we chose to use the height and tilt effect data to determine the platter velocity recipe which would achieve a predetermined non-uniform coating distribution on a flat (where such platter velocity recipe would achieve the desired uniform coating on the curved optic). FIG. 12 is a graph of film thickness as a function of radial position on a flat substrate, showing the non-uniform coating distribution on the flat substrate which would result if the two-velocity platter recipe "R1" shown in FIG. 13 were used to coat the flat substrate rather than the convex mirror assumed in FIGS. 10 and 11. FIG. 12 shows that a thinner coating at the center is required to compensate for the curvature of the convex optic.

FIG. 13 is a graph representing two-velocity platter recipes "R1" and "R2" used to produce the coatings mentioned above with reference to FIGS. 9–11. Two-velocity substrate sweep velocity function R2 was used to produce the uniform coating of FIG. 9 (on a flat, disk-shaped substrate having 6 inch diameter) in which V1=0.809, V2=0.684 (so that V2/V1=0.846), and the offset angle is 17.6 degrees. Sweep velocity function R2 assumes that the source is a rectangular source of size 4.3 inch ×10.7 inch, the center of the substrate is 8.75 inches from the center of the platter, and the substrate spins about its center relative to the platter at 320 rpm. The "offset angle" is the angle traversed by the substrate (as it is swept by the platter around the platter's center's axis and across the source) from the start of the recipe (which is typically when the angular position of the substrate is −45 degrees) until the time that the platter speed undergoes the transition from V2 to V1. The deposition run is considered to end when the angular position of the substrate is +45 degrees (which is typically shortly after the substrate's trailing edge leaves the source). Thus, the angular position of the substrate is zero (0) degrees when the center of the substrate is centered over the source. In implementing sweep velocity function R2, the platter sweeps the substrate at the lower velocity V2=0.684 rpm from the start of the recipe until the substrate has swept through an offset angle of 17.6 degrees. Then, the sweep velocity increases to V1=0.809 rpm and remains at V1 until the substrate center has reached a symmetric position on the other side of the source (i.e., 17.6 degrees before the end of the run at +45 degrees). Then, the platter sweeps the substrate at the lower velocity V2=0.684 until the end of the run. For simplicity, the velocity recipes are kept symmetrical in this way.

Still with reference to FIG. 13, two-velocity substrate sweep velocity function R1 was used to produce the coating of FIGS. 10–11 (on the above-described convex reflective optic. In sweep velocity function R1, the parameter V1=0.862 rpm, V2=0.696 rpm (so that V2/V1=0.808), and the offset angle is 23.7 degrees. Sweep velocity function R1 (like function R2) assumes that the source is a rectangular source of size 4.3 inch ×10.7 inch, the center of the substrate is 8.75 inches from the center of the platter, and the substrate spins about its center relative to the platter at 320 rpm.

In preferred implementations to be described with reference to FIGS. 14 and 15, a computer programmed in accordance with the invention has a user interface which displays predicted peak-to-valley coating thickness error for each of a number of substrate sweep velocity modulation recipes (preferably in the form of a contour map such as that shown in FIG. 14), and also displays a cursor (e.g., the arrow-shaped cursor of FIG. 14). By manipulating an input device (e.g., mouse 20B of FIG. 3) the user can select any of a number of points on the thickness error display. In response to each selected point, the computer displays a graph (e.g., that of FIG. 15) of predicted coating thickness as a function of position on the substrate (for the corresponding sweep velocity function). The graph of FIG. 15 indicates predicted coating thickness as a function of radial position on a radially symmetric substrate, for the sweep velocity function corresponding to the position of the cursor in FIG. 14 (i.e., the sweep velocity function characterized by V2/V1=0.85 and offset angle=20 degrees). This sweep velocity function is approximately the nearly optimal sweep velocity function mentioned above with reference to FIG. 8, in which V2/V1=0.846 and offset angle =20.4 degrees. By inspecting the graph for each of several points on the thickness error display (e.g., that of FIG. 14), the user can conveniently determine an optimal substrate sweep velocity function (for achieving a predetermined coating thickness profile on the substrate).

Figure 14:
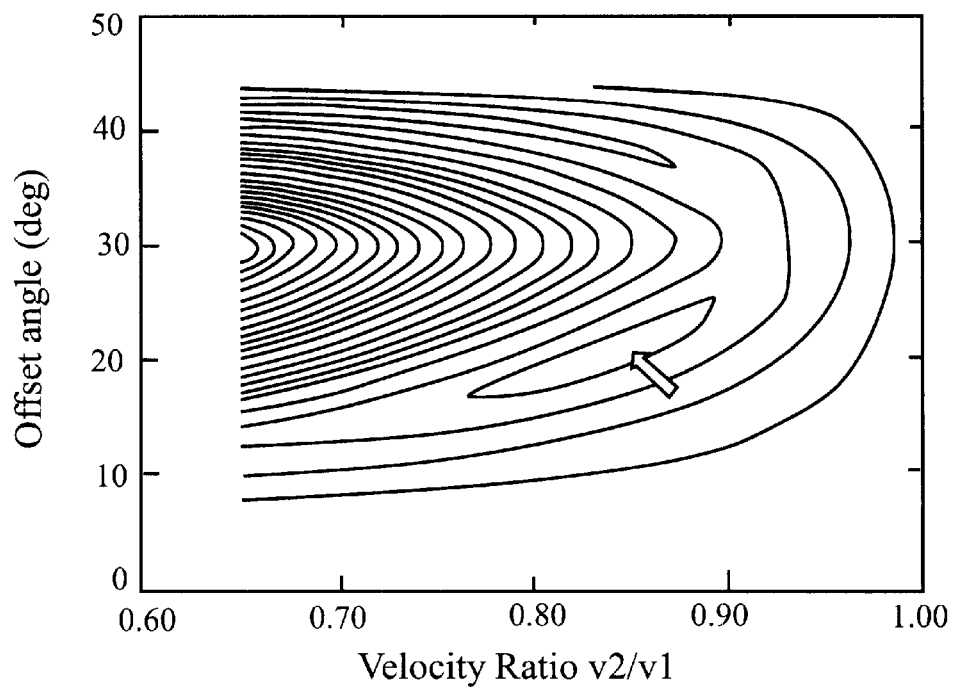
FIG. 14 is a screen display generated by a computer system programmed in accordance with a preferred embodiment of the invention, showing predicted deposited film thickness uniformity (peak to valley thickness difference) for the FIG. 3 system operated (with each of a set of two-velocity platter recipes) to coat a flat substrate.
Figure 15:
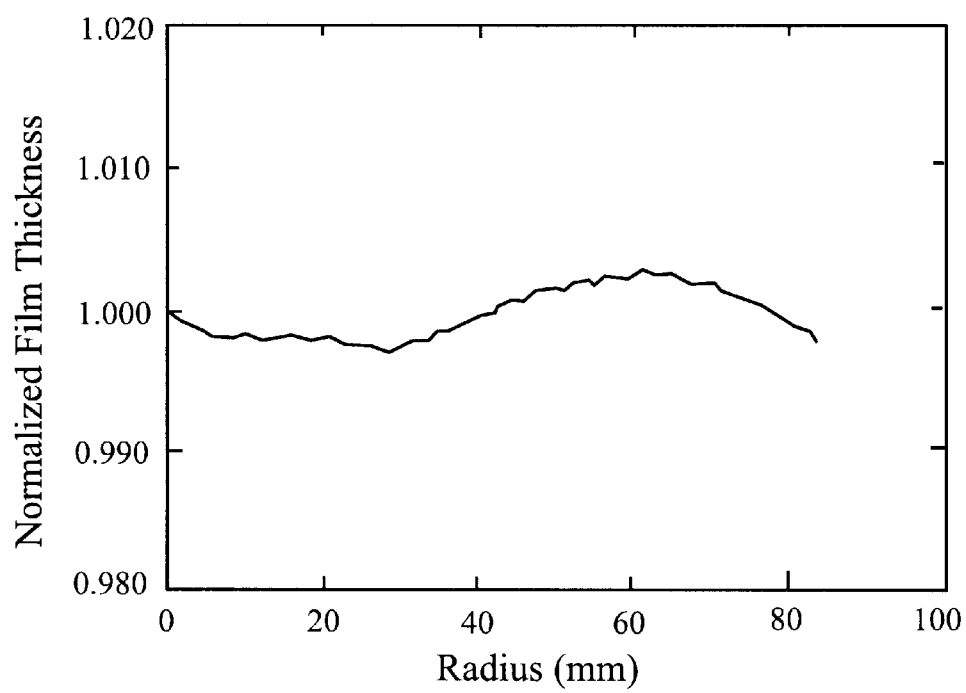
FIG. 15 is a screen display generated (by the computer system which generates FIG. 14) by clicking on the point (on the FIG. 14 display) indicated by the arrow-shaped cursor. The display of FIG. 15 is a graph of predicted film thickness as a function of radial position on the sample, for the FIG. 3 system operated with the two-velocity platter recipe having the V1, V2, and offset angle parameters of the point (on the FIG. 14 display) indicated by the arrow cursor.

In FIG. 14, each contour line represents sweep velocity functions predicted to cause a single unique thickness uniformity error (the difference between maximum (peak) coating thickness and minimum (valley) coating thickness). FIG. 14 is a contour map of the three-dimensional surface indicated in FIG. 7. The "lowest" points on the FIG. 14 contour map (those enclosed by the "lowest" contours) represent the most uniform coatings (and the sweep velocity functions which are predicted to produce such coatings). In a preferred implementation, the user clicks and holds a mouse button (with the cursor positioned at a desired point on the FIG. 14 display). In response, the computer displays a graph (such as that of FIG. 15) indicates predicted coating thickness as a function of radial position on the substrate (which is assumed to be a radially symmetric substrate), for the sweep velocity function corresponding to the position of the cursor. The appearance of the FIG. 15 graph changes dynamically as the cursor is moved across the FIG. 14 contour map (e.g., refreshing at 2 or 3 Hertz using a 233 MHz Pentium-powered personal computer).

The inventors have implemented a user interface of the type described with reference to FIGS. 14 and 15 on a personal computer (with a 233 MHz Pentium processor) in the IDL data processing environment. IDL ("Interactive Data Language") software is available from Research Systems, Inc. (of Boulder, Colo.), and is a language designed for data visualization and application development. This implementation of the invention uses straightforward numerical implementations of the above-described analytical expressions that are employed in the above-described preferred implementation of calculation (in accordance with the invention) of the coating thickness profile on a substrate to be coated. Implementing a user interface (of the type described with reference to FIGS. 14 and 15) in the IDL data processing environment allows the programmer to incorporate standard IDL routines for rapid interpolation, integration and animated graphing. In the IDL data processing environment, the quantities used in the calculations, such as the velocity recipe contained in $\theta(t)$, were represented as large arrays, because the IDL language has highly efficient routines for processing large arrays of data in parallel. The IDL language also provides for easy production of an animated display of data (such as in the graphical user interface described with reference to FIGS. 14 and 15), and for the dynamical choice of points from one window to be represented as a curve in another using the mouse. Provision of such a graphical user interface makes searching the available recipe space simple and provides a much better understanding of what thickness profiles are possible with two-velocity sweep profiles than could have been obtained by isolated calculations.

In alternative embodiments, the computed error values (employed to generate a contour map such as that of FIG. 14) are determined by application of a merit function which is indicative of the amount (or degree) of error between the predicted film thickness profile for each of the sweep velocity modulation recipes and the desired film thickness profile. Examples of such merit functions include (but are not limited to) the following: RMS (root mean squared)

error, standard deviation error, RMS error after subtraction of a function (e.g., a quadratic function) from the predicted film thickness profile for each sweep velocity modulation recipe, and peak-to-valley error. Each point on the resulting contour map has a magnitude and a position, each magnitude being indicative of the error value determined by application of the merit function to one of the predicted film thickness profiles, and each position being indicative of parameters which characterize a different one of the sweep velocity modulation recipes.

The inventors have recognized that slow (or zero) substrate spin speed (relative to the platter) while the platter sweeps the substrate across the source gives rise to a ripple effect (in which coating thickness varies as a function of radius across a radially symmetric substrate). For some applications, a slow or zero substrate spin speed can give a specially graded film thickness with azimuthal as well as radial thickness variation. The shape of such a variation could be predicted with the inventive software by simply varying the parameter for the substrate spin speed (which typically has a standard or default value of about 320 rpm).

Figure 17:
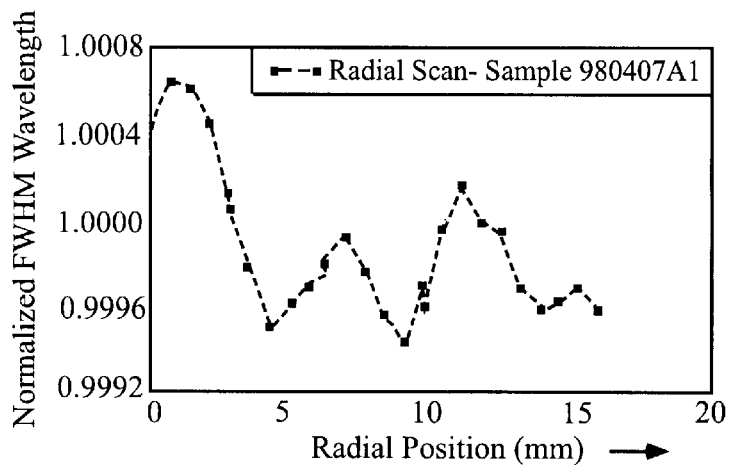
FIG. 17 is a graph of measured film thickness as a function of radial position (for the same sample as in FIG. 16), showing the ripple effect discussed herein.

For example, FIG. 17 is a graph of measured film thickness (of one layer of a multilayer coating) as a function of radial position for a disk-shaped sample having the multilayer coating, where the coating has been produced (using the FIG. 3 apparatus, assuming the source and substrate parameters, other than substrate spin speed, that were noted above with reference to function R2 of FIG. 13) with the substrate spinning at low speed with respect to the platter while the platter sweeps the substrate across the vapor deposition source. More precisely, FIG. 17 is the peak reflected wavelength reflected by the multilayer-coated sample as a function of radial distance from the center of the sample. The peak reflected wavelength is proportional to the period of the multilayer stack and hence to the physical thickness of each layer (the small dependence of the wavelength on the changing optical index of the materials is negligible over the small film thickness range indicated in FIG. 17).

FIG. 16 is a graph of thickness (of one layer of the multilayer coating of the sample measured to generate FIG. 17) as a function of radial position, as predicted in accordance with the invention. The measured ripple is consistent in magnitude and period with the predicted ripple, though since it is a resonance effect it is sensitive to starting parameters and would be difficult to predict exactly. It should be appreciated that the ripple effect was predicted (by software implementing the invention) before it was observed experimentally. The inventive software predicted that the magnitude of the ripple could be decreased to within predetermined (desired) limits by increasing the substrate spin speed (so that by increasing the speed to 320 rpm, the ripple decreased to the level inherent in FIG. 9).

The present invention is not limited to determine sweep velocity modulation recipes for achieving uniform thickness coatings (on flat or curved substrates). It can also be used to determine sweep velocity modulation recipes for achieving coatings in which the coating thickness is graded (or otherwise varies) across a flat or curved substrate. Optical coatings commonly have such prescriptions in order to compensate for variations in the incident angle of light across the optic. The invention thus eliminates the need for use of a precisely constructed shadow mask (e.g., made of aluminum milled to block portions of the source, shaping it to deliver the desired thickness profile on the substrate) over each substrate to achieve a desired non-uniform coating on the substrate.

In other embodiments, the invention is a method of processing data indicative of the flux distribution of a vapor deposition source, and data indicative of "offset angles" traversed by the substrate as it is swept by a rotating platter around the platter's axis of rotation and across the source (each offset angle being the angle traversed by the substrate relative to the source from the start of the recipe until the time that the substrate's sweep speed undergoes a transition from one value to another value), to determine a predicted film thickness profile for each of a set of three-velocity sweep recipes. Each three-velocity sweep recipe specifies that the substrate sweeps across the source with a sequence of three velocities (V1, V2, and V3), and is characterized by four free parameters: the ratio V2/V1, the ratio V3/V1, a first offset angle (specifying the transition from V1 to V2), and a second offset angle (specifying the transition from V2 to V3).

In some embodiments, the inventive method is used to determine the parameters needed for depositing a custom film, having a very precise thickness profile, on a curved optic. Such custom film can be an underlayer which underlies a multilayer coating, and which can alter the figure of the optic by hundreds of nanometers (or more). If a precision surface is produced and polished, and then found to have the wrong figure, the invention could be performed to determine how to correct the figure. We contemplate that such embodiments of the invention would typically be applied to correct overall shape; not to correct scratches and other localized errors (although it could be applied to correct localized errors).

Different embodiments of the invention assume different geometries for the apparatus employed to effect relative motion of the vapor deposition source and substrate, such that the substrate is exposed to the source to be coated by vapor deposition. Some embodiments (including the preferred embodiments described above) assume rotational motion of the substrate relative to one or more fixed sources. Others assume rotational motion of one or more sources relative to a fixed substrate. Other embodiments assume linear (or other non-rotational) motion of a substrate relative to a fixed source (or of a source relative to a fixed substrate). In the claims, the expression that a substrate "sweeps" (or is swept) across (or relative to) a source is intended to cover all such cases (including cases in which the substrate is fixed in some frame of reference and the source moves relative to the substrate in such frame of reference). Of course, in embodiments in which the substrate is fixed and the source moves, the expression "sweep velocity modulation recipe" denotes the sweep velocity of the source relative to the substrate as a function of time during a time interval in which the source sweeps across the substrate.

One class of preferred embodiments of the invention assumes that the substrate undergoes rotational motion relative to a fixed source by being swept by a rotating platter relative to the source, while the substrate spins about its own central axis (or center of mass). In other embodiments, the substrate spins about a fixed axis while the source moves (rotationally, linearly, or otherwise) relative to the substrate. In other embodiments, the substrate undergoes linear or other non-rotational motion relative to a fixed source, while the substrate spins about its own central axis (or center of mass).

In the preferred embodiments described with reference to FIG. 3, the substrate sequentially sweeps across two fixed sources during each full platter rotation. In other embodiments of the invention, the substrate sequentially sweeps across three or more fixed sources during each full platter rotation (or the substrate otherwise periodically sweeps across three or more sources), so that multi-layer coatings can be conveniently deposited on the substrate.

It is contemplated that the inventive method can be performer iteratively (with any number of iterations) to determine, from a set of predicted film thickness profiles and measured thickness data, a sweep velocity modulation recipe that is adequate to achieve a desired thickness profile. For example, after measuring the flux distribution of a vapor deposition source (e.g., by holding a patterned wafer stationary relative to the source while performing a vapor deposition operation in which the source deposits a test film of material on the wafer, and then measuring the thickness of the test film as a function of position on the wafer) and calculating a set of predicted film thickness profiles (each of the film thickness profiles assuming that the substrate is swept across a source having the measured flux distribution with a different one of a set of sweep velocity modulation recipes), one embodiment of the invention includes the following additional steps:

(1) determining from the predicted film thickness profiles a first one of the sweep velocity modulation recipes which is predicted to achieve a thickness profile at least approximately matching the desired thickness profile (e.g., by selecting a point on a contour map display of the type shown in FIG. 14);

(2) performing a vapor deposition operation in which the source deposits a film on a test substrate while the test substrate is swept across the source in accordance with the first one of the sweep velocity modulation recipes;

(3) generating measured thickness data by measuring the thickness (as a function of position on the test substrate) of the film deposited in step (2); and (4) determining, from the predicted film thickness profiles and the measured thickness data, a second one of the sweep velocity modulation recipes which is adequate (or predicted to be adequate) to achieve the desired thickness profile. Step (4) can be accomplished by identifying errors in the thickness profile produced on the test substrate during step (2), and selecting a different point on the contour map display employed in step (1) such that the sweep velocity modulation recipe corresponding to such different point is expected to compensate for the identified thickness profile errors (without introducing significant additional error) and thus achieve the desired thickness profile.

Of course, an additional iteration can be accomplished by performing the following additional steps:

(5) after step (4), performing another vapor deposition operation in which the source deposits a film on a second test substrate while the second test substrate is swept across the source in accordance with the second one of the sweep velocity modulation recipes;

(6) generating additional measured thickness data by measuring the thickness (as a function of position on the second test substrate) of the film deposited in step (5); and (7) determining, from the predicted film thickness profiles and the additional measured thickness data, a third one of the sweep velocity modulation recipes which is adequate (or predicted to be adequate) to achieve the desired thickness profile. Step (7) can be accomplished by identifying errors in the thickness profile produced on the second test substrate during step (5), and selecting a third point on the contour map display employed in step (1), such that the sweep velocity modulation recipe corresponding to such third point is expected v to compensate for the identified thickness profile errors (without introducing significant additional error) and thus achieve the desired thickness profile. Additional (third and subsequent) iterations can be performed in the same way.

The foregoing is merely illustrative and explanatory of preferred embodiments of the inventive methods and apparatus. Various changes in the details of the embodiments described herein may be within the scope of the appended claims. The invention pertains to methods and systems for vapor deposition such as methods and systems for sputtering (including DC magnetron sputtering as well as other types of sputtering), CVD, and electron beam evaporation, including the steps of measuring the source flux distribution (using a test piece that is held stationary in a position in which it is exposed to the source), calculating the predicted thickness profile of the film under any of a variety of sweep velocity modulation recipes (assuming the measured source flux distribution), and then determining an optimal (or nearly optimal) sweep velocity modulation recipe to achieve a desired thickness profile (or elements configured to perform such steps).

What is claimed is:

1. A method for measuring flux distribution of a vapor deposition source, including the steps of:

(a) holding a patterned wafer stationary relative to the source, the wafer having a layer of photoresist material with a pattern of features in the layer of photoresist material;

(b) while performing step (a), performing a vapor deposition operation in which the source coats a film of material on the photoresist material and in the features;

(c) after step (b), performing a lift-off operation to remove from the wafer the photoresist material and the vapor deposited material on said photoresist material, so that the vapor deposited material in the features remains as an array of elevated features on the wafer, each of the elevated features having a thickness; and (d) measuring the thickness of each of the elevated features using a profilometer to generate flux distribution data indicative of feature thickness as a function of position on the wafer, the flux distribution data determining the flux distribution of the source.

2. The method of claim 1, also including the steps of:

processing sweep velocity modulation recipe data with said flux distribution data to generate a set of predicted thickness profiles for films deposited by the source on a substrate, wherein the sweep velocity modulation recipe data determines a set of predetermined sweep velocity modulation recipes, each of the predicted thickness profiles assumes a different one of the sweep velocity modulation recipes, and each of the sweep velocity modulation recipes determines a different substrate sweep velocity as a function of time during a sweep of the substrate across the source; and determining from the predicted thickness profiles a first sweep velocity modulation recipe for achieving a selected thickness profile for a film deposited on the substrate as said substrate is swept across the source in accordance with said first sweep velocity modulation recipe.

3. The method of claim 1, wherein the vapor deposition source comprises a magnetron and a target, the target being positioned in electric and magnetic fields produced by the magnetron such that ions present in the fields accelerate toward and are incident on the target, said method including the steps of:

processing sweep velocity modulation recipe data with said flux distribution data to generate predicted thickness profiles of films deposited by the source on a substrate, wherein the sweep velocity modulation recipe data determines a set of predetermined sweep velocity modulation recipes, each of the predicted thickness profiles is for a different one of the sweep velocity modulation recipes, and each of the sweep velocity modulation recipes determines a different substrate sweep velocity as a function of time during a sweep of the substrate across the source; and determining from the predicted thickness profiles a first sweep velocity modulation recipe for achieving a selected thickness profile of a film deposited on the substrate as said substrate is swept across the source with a sweep velocity as a function of time that is determined by said first sweep velocity modulation recipe.

4. The method of claim 1, also including the step of:

before step (a), producing the patterned wafer by performing a photoresist/lithographic operation on an unpatterned wafer having an unpatterned layer of photoresist, to produce said pattern of features in said layer.

5. A method for depositing a film on a substrate using a vapor deposition source having a flux distribution, including the steps of:

(a) measuring the flux distribution by holding a patterned wafer stationary relative to the source while performing a vapor deposition operation in which the source deposits a test film of material on the wafer, then measuring the thickness of the test film as a function of position on the wafer, thereby generating data determining said flux distribution;

(b) calculating a set of predicted film thickness profiles, each of the film thickness profiles assuming that the substrate is swept across a source,having the measured flux distribution with a different one of a set of sweep velocity modulation recipes; and (c) determining from the predicted film thickness profiles one of the sweep velocity modulation recipes which is adequate to achieve a desired thickness profile, having a predetermined characteristic, for film deposition on the substrate as said substrate is swept across the source in accordance with said one of the sweep velocity modulation recipes.

6. The method of claim 5, also including the step of:

performing a vapor deposition operation in which the source deposits a film of the material on the substrate while said substrate is swept across the source in accordance with said one of the sweep velocity modulation recipes.

7. The method of claim 5, wherein the patterned wafer includes a layer of photoresist material with a pattern of features in the layer of photoresist material, and wherein step (a) includes the steps of:

after the test film has been on deposited on the patterned wafer, performing a lift-off operation to remove from said patterned wafer the photoresist material together with the vapor deposited material on the photoresist, so that the vapor deposited material in the features remains as an array of elevated features on the wafer, each of the elevated features having a thickness, and measuring the thickness of each of the elevated features using a mechanical profilometer to generate flux distribution data indicative of feature thickness as a function of position on the wafer, such that said flux distribution data determines the flux distribution.

8. The method of claim 5, wherein step (c) includes the steps of:

(d) determining from the predicted film thickness profiles a first one of the sweep velocity modulation recipes which is predicted to achieve a thickness profile at least approximately matching the desired thickness profile;

(e) performing a vapor deposition operation in which the source deposits a film of the material on a test substrate while the test substrate is swept across the source in accordance with the first one of the sweep velocity modulation recipes;

(f) generating measured thickness data by measuring thickness as a function of position on the test substrate of the film deposited in step (e); and (g) determining, from the predicted film thickness profiles and the measured thickness data, said one of the sweep velocity modulation recipes which is adequate to achieve the desired thickness profile.

9. The method of claim 5, wherein step (c) includes the steps of:

(d) determining from the predicted film thickness profiles a first one of the sweep velocity modulation recipes which is predicted to achieve a thickness profile at least approximately matching the desired thickness profile;

(e) performing a vapor deposition operation in which the source deposits a film of the material on a test substrate while the test substrate is swept across the source in accordance with the first one of the sweep velocity modulation recipes;

(f) generating measured thickness data by measuring thickness as a function of position on the test substrate of the film deposited in step (e);

(g) determining, from the predicted film thickness profiles and the measured thickness data, a second one of the sweep velocity modulation recipes which is predicted to achieve another thickness profile at least approximately matching the desired thickness profile;

(h) performing another vapor deposition operation in which the source deposits a film of the material on a second test substrate while the second test substrate is swept across the source in accordance with the second one of the sweep velocity modulation recipes;

(i) generating additional measured thickness data by measuring thickness as a function of position on the second test substrate of the film deposited in step (h); and (j) determining, from the predicted film thickness profiles and the additional measured thickness data, said one of the sweep velocity modulation recipes which is adequate to achieve the desired thickness profile.

10. The method of claim 5, wherein step (c) includes the steps of:

(d) determining from the predicted film thickness profiles one of the sweep velocity modulation recipes which is predicted to achieve a thickness profile at least approximately matching the desired thickness profile;

(e) performing a vapor deposition operation in which the source deposits a film of the material on a test substrate while the test substrate is swept across the source in accordance with said one of the sweep velocity modulation recipes;

(f) generating measured thickness data by measuring thickness as a function of position on the test substrate of the film deposited in step (e);

(g) determining, from the predicted film thickness profiles and the measured thickness data, a different one of the sweep velocity modulation recipes which is predicted to achieve another thickness profile at least approximately matching the desired thickness profile;

(h) performing at least one iteration of steps (e), (f) and (g), wherein during each performance of step (e), a different test substrate is swept across the source in accordance with the one of the sweep velocity modulation recipes determined in the most recent performance of step (g), and wherein the final performance of step (g) determines said one of the sweep velocity modulation recipes which is adequate to achieve the desired thickness profile.

11. A method for determining a sweep velocity modulation recipe for achieving a selected thickness profile of a film deposited on a substrate by sweeping said substrate across a vapor deposition source with a sweep velocity as a function of time determined by said sweep velocity modulation recipe, wherein the source has a flux distribution, said method including the steps of:

(a) measuring the flux distribution of the source, thereby generating data determining said flux distribution;

(b) processing sweep velocity modulation recipe data with the data determining said flux distribution to generate a set of predicted thickness profiles of films deposited by the source on a substrate, wherein the sweep velocity modulation recipe data determines a set of predetermined sweep velocity modulation recipes, each of the predicted thickness profiles assumes and corresponds to a different one of the sweep velocity modulation recipes, and each of the sweep velocity modulation recipes determines a different substrate sweep velocity as a function of time during a sweep of the substrate across the source; and (c) determining from the predicted thickness profiles said sweep velocity modulation recipe for achieving the selected thickness profile.

12. The method of claim 11, wherein step (b) includes the steps of:

for each of the sweep velocity modulation recipes, determining the time that each point of a set of points on the substrate spends over each of a set of points of the source during the sweep;

generating a set of product values by multiplying each such time by the rate of film deposition at the corresponding point of the source; and summing the product values to generate, for said each of the sweep velocity modulation recipes, a set of predicted thickness values comprising a predicted thickness value for each point of the set of points of the substrate.

13. The method of claim 12, wherein step (c) includes the step of:

generating error values from the predicted thickness values, each of the error values being indicative of an amount of film thickness nonuniformity associated with a different one of the sweep velocity modulation recipes.

14. The method of claim 13, wherein step (c) also includes the step of:

processing the error values to generate and display a contour map, each contour line of the contour map being indicative of those of the sweep velocity modulation recipes that are predicted to cause a particular amount of film thickness nonuniformity.

15. The method of claim 12, wherein step (c) includes the step of:

generating error values from the predicted thickness values, each of the error values being indicative of an amount of film thickness error associated with a different one of the sweep velocity modulation recipes.

16. The method of claim 15, wherein step (c) also includes the step of:

processing the error values to generate and display a contour map, each contour line of the contour map being indicative of those of the sweep velocity modulation recipes that are predicted to cause a particular amount of film thickness error.

17. The method of claim 16, wherein each of the error values is determined by application of a merit function to a different one of the predicted thickness profiles, each point on the contour map has a magnitude and a position, each said magnitude is indicative of one of the error values, and each said position is indicative of parameters characterizing a different one of the sweep velocity modulation recipes.

18. The method of claim 17, wherein said parameters include a sweep velocity ratio and an offset angle, wherein the offset angle indicates a transition point during the sweep where substrate sweep speed undergoes a transition from a first speed to a second speed.

19. The method of claim 17, wherein said parameters include at least two sweep velocity ratios and at least two offset angles, wherein one of the offset angles indicates a transition point during the sweep where substrate sweep speed undergoes a transition from a first speed to a second speed, and another of the offset angles indicates a second transition point during the sweep where substrate sweep speed undergoes a transition from the second speed to a third speed.

20. The method of claim 16, wherein each of the error values is indicative of a peak thickness to valley thickness difference resulting from a different one of the sweep velocity modulation recipes, each point on the contour map has a magnitude and a position, each said magnitude is indicative of peak to valley thickness difference error, and each said position is indicative of parameters characterizing a different one of the sweep velocity modulation recipes.

21. The method of claim 15, wherein step (c) also includes the steps of:

producing a user interface which includes a displayed contour map, including by processing the error values to generate the contour map, wherein each contour line of the contour map is indicative of those of the sweep velocity modulation recipes that are predicted to cause a particular amount of film thickness error; and in response to selecting a point on the displayed contour map, graphically displaying one of the predicted thickness profiles that corresponds to said point on the contour map.

22. The method of claim 21, wherein each of the error values is indicative of a peak thickness to valley thickness difference resulting from a different one of the sweep velocity modulation recipes, each point on the displayed contour map has a magnitude and a position, each said magnitude is indicative of peak to valley thickness difference error, and each said position is indicative of parameters characterizing a different one of the sweep velocity modulation recipes.

23. The method of claim 21, wherein each of the error values is determined by application of a merit function to a different one of the predicted thickness profiles, each point on the displayed contour map has a magnitude and a position, each said magnitude is indicative of one of the error values, and each said position is indicative of parameters characterizing a different one of the sweep velocity modulation recipes.

24. The method of claim 11, also including the step of:
performing a vapor deposition operation in which the source deposits a film on the substrate while said substrate is swept across the source in accordance with said sweep velocity modulation recipe for achieving the selected thickness profile.

25. The method of claim 11, wherein the vapor deposition source is a magnetron sputtering deposition source, said method also including the step of depositing a film on the substrate while said substrate is swept across the source in accordance with said sweep velocity modulation recipe for achieving the selected thickness profile.

26. The method of claim 11, wherein the substrate is a flat substrate.

27. The method of claim 11, wherein the substrate is an optic having nonzero curvature.

28. The method of claim 11, wherein the substrate is an optic having a figure to be corrected by deposition of the film on said optic, and wherein the selected thickness profile of the film is such that deposition of the film onto the optic achieves a desired correction of said figure of the optic.

29. The method of claim 11, wherein step (c) includes the steps of:
(d) determining from the predicted thickness profiles a first one of the sweep velocity modulation recipes which is predicted to achieve a thickness profile at least approximately matching the selected thickness profile;
(e) performing a vapor deposition operation in which the source deposits a film of the material on a test substrate while the test substrate is swept across the source in accordance with the first one of the sweep velocity modulation recipes;
(f) generating measured thickness data by measuring thickness as a function of position on the test substrate of the film deposited in step (e); and
(g) determining, from the predicted film thickness profiles and the measured thickness data, said sweep velocity modulation recipe for achieving the selected thickness profile.

30. The method of claim 11, wherein step (c) includes the steps of:
(d) determining from the predicted thickness profiles one of the sweep velocity modulation recipes which is predicted to achieve a thickness profile at least approximately matching the selected thickness profile;
(e) performing a vapor deposition operation in which the source deposits a film of the material on a test substrate while the test substrate is swept across the source in accordance with said one of the sweep velocity modulation recipes;
(f) generating measured thickness data by measuring thickness as a function of position on the test substrate of the film deposited in step (e);
(g) determining, from the predicted thickness profiles and the measured thickness data, a different one of the sweep velocity modulation recipes which is predicted to achieve another thickness profile at least approximately matching the selected thickness profile;
(h) performing at least one iteration of steps (e), (f) and (g), wherein during each performance of step (e), a different test substrate is swept across the source in accordance with the one of the sweep velocity modulation recipes determined in the most recent performance of step (g), and wherein the final performance of step (g) determines said sweep velocity modulation recipes for achieving the selected thickness profile.

31. A system, including:
a vapor deposition apparatus including a vapor deposition source having a known flux distribution, a substrate, a rotatable platter to which the substrate is mounted, and a platter drive assembly coupled to the platter and configured to rotate the platter to sweep the substrate across the source with controlled sweep velocity; and
a programmed computer coupled to the platter drive assembly, wherein the programmed computer includes a display device and is programmed with software for determining a sweep velocity modulation recipe for achieving a selected thickness profile of a film deposited on the substrate as a result of sweeping said substrate across the source with a time-varying sweep velocity that is determined by said sweep velocity modulation recipe, wherein said software includes:
software for processing sweep velocity modulation recipe data with data determining said flux distribution to generate a set of predicted thickness profiles of films deposited by the source on a substrate, wherein the sweep velocity modulation recipe data determines a set of predetermined sweep velocity modulation recipes, each of the predicted thickness profiles assumes and corresponds to a different one of the sweep velocity modulation recipes, and each of the sweep velocity modulation recipes determines a different substrate sweep velocity as a function of time during a sweep of the substrate across the source; and
software for determining from the predicted thickness profiles said sweep velocity modulation recipe for achieving the selected thickness profile.

32. The system of claim 31, wherein the software for processing the sweep velocity modulation recipe data with the data determining said flux distribution to generate said predicted thickness profiles includes:
software for determining, for each of the substrate sweep velocity modulation recipes, the time that each point of a set of points on the substrate spends over each of a set of points of the source during the sweep;
software for generating a set of product values by multiplying each such time by the rate of film deposition at the corresponding point of the source; and
software for summing the product values to generate, for said each of the substrate sweep velocity modulation recipes, a set of predicted thickness values comprising a predicted thickness value for each point of the set of points of the substrate.

33. The system of claim 32, wherein the software for determining from the predicted thickness profiles said sweep velocity modulation recipe includes:
software for generating error values from the predicted thickness values, each of the error values being indicative of an amount of film thickness nonuniformity associated with a different one of the sweep velocity modulation recipes; and
software for processing the error values to generate a contour map which is displayed on the display device, each contour line of the contour map being indicative of those of the sweep velocity modulation recipes that are predicted to cause a particular amount of film thickness error.

34. The system of claim 32, wherein the software for determining from the predicted thickness profiles said sweep velocity modulation recipe includes:

software for generating error values from the predicted thickness values, each of the error values being indicative of an amount of film thickness error associated with a different one of the sweep velocity modulation recipes; and software for processing the error values to generate a contour map which is displayed on the display device, each contour line of the contour map being indicative of those of the sweep velocity modulation recipes that are predicted to cause a particular amount of film thickness error.

35. A computer implemented method, including the steps of:

(a) processing measured flux distribution data indicative of a flux distribution of a vapor deposition source to generate profiles of predicted vapor deposited film thickness on a substrate that would result from sweeping the substrate across the source according to each of a set of predetermined sweep velocity modulation recipes, including by calculating the trajectory of each of a set of points on the substrate over the source during each sweep, and integrating the flux received at each of the set of points on the substrate to obtain a predicted film thickness at said each of the set of points on the substrate during said each sweep; and (b) determining from the profiles of predicted vapor deposited film thickness a sweep velocity modulation recipe for achieving a selected vapor deposited thickness profile on the substrate.

36. The method of claim 35, wherein step (b) includes the steps of:

(c) determining from the profiles of predicted vapor deposited film thickness a first one of the sweep velocity modulation recipes which is predicted to achieve a thickness profile at least approximately matching the selected vapor deposited thickness profile;

(d) performing a vapor deposition operation in which the source deposits a film of the material on a test substrate while the test substrate is swept across the source in accordance with the first one of the sweep velocity modulation recipes;

(e) generating measured thickness data by measuring thickness as a function of position on the test substrate of the film deposited in step (d); and (f) determining, from the profiles of predicted vapor deposited film thickness and the measured thickness data, said sweep velocity modulation recipe for achieving the selected vapor deposited thickness profile on the substrate.

37. The method of claim 35, wherein step (b) includes the steps of:

(c) determining from the profiles of predicted vapor deposited film thickness a first one of the sweep velocity modulation recipes which is predicted to achieve a thickness profile at least approximately matching the selected vapor deposited thickness profile;

(d) performing a vapor deposition operation in which the source deposits a film of the material on a test substrate while the test substrate is swept across the source in accordance with the first one of the sweep velocity modulation recipes;

(e) generating measured thickness data by measuring thickness as a function of position on the test substrate of the film deposited in step (d);

(f) determining, from the profiles of predicted vapor deposited film thickness and the measured thickness data, a second one of the sweep velocity modulation recipes which is predicted to achieve another vapor deposited thickness profile at least approximately matching the selected vapor deposited thickness profile;

(g) performing another vapor deposition operation in which the source deposits a film of the material on a second test substrate while the second test substrate is swept across the source in accordance with the second one of the sweep velocity modulation recipes;

(h) generating additional measured thickness data by measuring thickness, as a function of position on the second test substrate, of the film deposited in step (g); and (i) determining, from the profiles of predicted vapor deposited film thickness and the additional measured thickness data, said sweep velocity modulation recipe for achieving the selected vapor deposited thickness profile on the substrate.

38. A method for depositing a film on a substrate using a vapor deposition source having a flux distribution, including the steps of:

(a) calculating a set of predicted film thickness profiles, each of the film thickness profiles assuming that the substrate is swept across a source having the flux distribution with a different one of a set of sweep velocity modulation recipes; and (b) determining from the predicted film thickness profiles one of the sweep velocity modulation recipes which is adequate to achieve a desired thickness profile, having a predetermined characteristic, for film deposition on the substrate as said substrate is swept across the source in accordance with said one of the sweep velocity modulation recipes.

39. The method of claim 38, also including the step of:

(c) performing a vapor deposition operation in which the source deposits a film of the material on the substrate while said substrate is swept across the source in accordance with said one of the sweep velocity modulation recipes.

40. The method of claim 38, wherein step (b) includes the steps of:

(c) determining from the predicted film thickness profiles a first one of the sweep velocity modulation recipes which is predicted to achieve a thickness profile at least approximately matching the desired thickness profile;

(d) performing a vapor deposition operation in which the source deposits a film of the material on a test substrate while the test substrate is swept across the source in accordance with the first one of the sweep velocity modulation recipes;

(e) generating measured thickness data by measuring thickness as a function of position on the test substrate of the film deposited in step (d); and (f) determining, from the predicted film thickness profiles and the measured thickness data, said one of the sweep velocity modulation recipes which is adequate to achieve the desired thickness profile.

41. The method of claim 38, wherein step (b) includes the steps of:

(c) determining from the predicted film thickness profiles a first one of the sweep velocity modulation recipes which is predicted to achieve a thickness profile at least approximately matching the desired thickness profile;

(d) performing a vapor deposition operation in which the source deposits a film of the material on a test substrate while the test substrate is swept across the source in accordance with the first one of the sweep velocity modulation recipes;

(e) generating measured thickness data by measuring thickness as a function of position on the test substrate of the film deposited in step (d);

(f) determining, from the predicted film thickness profiles and the measured thickness data, a second one of the sweep velocity modulation recipes which is predicted to achieve another thickness profile at least approximately matching the desired thickness profile;

(g) performing another vapor deposition operation in which the source deposits a film of the material on a second test substrate while the second test substrate is swept across the source in accordance with the second one of the sweep velocity modulation recipes;

(h) generating additional measured thickness data by measuring thickness as a function of position on the second test substrate of the film deposited in step (g); and (i) determining, from the predicted film thickness profiles and the additional measured thickness data, said one of the sweep velocity modulation recipes which is adequate to achieve the desired thickness profile.

42. A method for determining a sweep velocity modulation recipe for achieving a selected thickness profile of a film deposited on a substrate by sweeping said substrate across a vapor deposition source with a sweep velocity as a function of time determined by said sweep velocity modulation recipe, wherein the source has a flux distribution, said method including the steps of:

(a) processing sweep velocity modulation recipe data with data indicative of the flux distribution to generate a set of predicted thickness profiles of films deposited by the source on a substrate, wherein the sweep velocity modulation recipe data determines a set of predetermined sweep velocity modulation recipes, each of the predicted thickness profiles assumes and corresponds to a different one of the sweep velocity modulation recipes, and each of the sweep velocity modulation recipes determines a different substrate sweep velocity as a function of time during a sweep of the substrate across the source; and (b) determining from the predicted thickness profiles said sweep velocity modulation recipe for achieving the selected thickness profile.

43. The method of claim 42, wherein step (a) includes the steps of:

for each of the sweep velocity modulation recipes, determining the time that each point of a set of points on the substrate spends over each of a set of points of the source during the sweep;

generating a set of product values by multiplying each such time by the rate of film deposition at the corresponding point of the source; and summing the product values to generate, for said each of the sweep velocity modulation recipes, a set of predicted thickness values comprising a predicted thickness value for each point of the set of points of the substrate.

44. The method of claim 42, wherein the substrate is a flat substrate.

45. The method of claim 42, wherein the substrate is an optic having nonzero curvature.

46. The method of claim 42, wherein the substrate is an optic having a figure to be corrected by deposition of the film on said optic, and wherein the selected thickness profile of the film is such that deposition of the film onto the optic achieves a desired correction of said figure of the optic.

47. The method of claim 42, wherein step (b) includes the steps of:

(c) determining from the predicted thickness profiles a first one of the sweep velocity modulation recipes which is predicted to achieve a thickness profile at least approximately matching the selected thickness profile;

(d) performing a vapor deposition operation in which the source deposits a film of the material on a test substrate while the test substrate is swept across the source in accordance with the first one of the sweep velocity modulation recipes;

(e) generating measured thickness data by measuring thickness as a function of position on the test substrate of the film deposited in step (d); and (f) determining, from the predicted film thickness profiles and the measured thickness data, said sweep velocity modulation recipe for achieving the selected thickness profile.

* * * * *